(12) United States Patent
Ikeuchi

(10) Patent No.: US 8,803,402 B2
(45) Date of Patent: Aug. 12, 2014

(54) ELASTIC WAVE DEVICE

(75) Inventor: Satoru Ikeuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 268 days.

(21) Appl. No.: 13/519,701

(22) PCT Filed: Feb. 24, 2011

(86) PCT No.: PCT/JP2011/001048
§ 371 (c)(1),
(2), (4) Date: Jun. 28, 2012

(87) PCT Pub. No.: WO2011/108229
PCT Pub. Date: Sep. 9, 2011

(65) Prior Publication Data
US 2012/0286624 A1  Nov. 15, 2012

(30) Foreign Application Priority Data
Mar. 4, 2010 (JP) .................. 2010-047436

(51) Int. Cl.
*H03H 9/25* (2006.01)
*H03H 9/145* (2006.01)
*H03H 9/02* (2006.01)
*H03H 9/64* (2006.01)

(52) U.S. Cl.
CPC ....... H03H 9/14561 (2013.01); H03H 9/14547 (2013.01); H03H 9/1457 (2013.01); H03H 9/02858 (2013.01); H03H 9/02881 (2013.01); H03H 9/6463 (2013.01)
USPC .............. 310/313 B; 310/313 D; 310/313 A

(58) Field of Classification Search
CPC .. H03H 3/08; H03H 9/14547; H03H 9/14505
USPC ....... 310/313 B, 313 A, 313 C, 313 D, 313 R, 310/365, 366; 333/193–196
See application file for complete search history.

(56) References Cited

U.S. PATENT DOCUMENTS

| 3,961,293 | A * | 6/1976 | Hartmann et al. | 310/313 D |
| 6,259,186 | B1 * | 7/2001 | Shibata et al. | 310/313 A |
| 7,902,716 | B2 * | 3/2011 | Tanaka et al. | 310/313 D |
| 8,310,321 | B2 * | 11/2012 | Kadota | 310/313 A |

FOREIGN PATENT DOCUMENTS

| JP | 07122965 A | 5/1995 |
| JP | 09162679 A | 6/1997 |
| JP | 11298286 A | 10/1999 |
| JP | 2001267880 A | 9/2001 |
| JP | 2003188676 A | 7/2003 |

OTHER PUBLICATIONS

International Application Serial No. PCT/JP2011/001048, International Search Report mailed Mar. 29, 2011, 4 pgs.

* cited by examiner

*Primary Examiner* — Thomas Dougherty
*Assistant Examiner* — Karen B Addison
(74) *Attorney, Agent, or Firm* — RatnerPrestia

(57) ABSTRACT

An elastic wave device includes an elastic wave resonator which includes a comb-shaped electrode pair including a pair of com-shaped electrodes interdigitating with each other and provided on a piezoelectric substrate and which is configured to trap energy of the elastic wave therein. Each of the pair of comb-shaped electrodes includes interdigital electrode fingers connected to a common. A pitch of the interdigital electrode fingers changes along a direction perpendicular to a propagation direction of elastic wave. The elastic wave device has a small insertion loss and operates efficiently.

22 Claims, 19 Drawing Sheets

ELASTIC WAVE DEVICE

This application is a U.S. National phase application of PCT International application No. PCT/JP2011/001048.

TECHNICAL FIELD

The present invention relates to an elastic wave device to be used chiefly in mobile communication devices.

BACKGROUND ART

In recent years, a ladder filter formed by combining elastic wave resonators, each of which has a terminal pair, has been widely used at an RF stage of portable phones. A longitudinally coupled resonator type elastic filter including plural electrode pairs has been also widely used in the RF stage.

FIG. 11 shows an electrode pattern of conventional elastic wave device 501. Elastic eave device 501 includes piezoelectric substrate 1, a pair of reflecting electrodes 2 and a pair of comb-shaped electrodes 5. Both of electrodes 2 and 5 are formed on substrate 1. Comb-shaped electrode pair 5 is disposed between the pair of reflecting electrodes 2, and electrode pair 5 interdigitates. Comb-shaped electrode 5 includes common electrode 3 and plural electrode fingers 4 connected to common electrode 3. Elastic wave device 501 constitutes an acoustic surface wave resonator on piezoelectric substrate 1 for trapping energy of the elastic wave therein.

In recent years communication devices have been downsized and the frequency band to be used has been densified due to a large number of users, so that a highly efficient elastic wave device having less insertion loss is required for those communication devices to operate reliably.

A conventional elastic wave device similar to elastic wave device 501 is disclosed in Patent Literature 1.

CITATION LIST

Patent Literature

Patent Literature 1: Japanese Patent Laid-Open Publication No. 11-298286

SUMMARY OF INVENTION

An elastic wave device includes an elastic wave resonator which includes a comb-shaped electrode pair including a pair of com-shaped electrodes interdigitating with each other and provided on a piezoelectric substrate and which is configured to trap energy of the elastic wave therein. Each of the pair of comb-shaped electrodes includes interdigital electrode fingers connected to a common. A pitch of the interdigital electrode fingers changes along a direction perpendicular to a propagation direction of elastic wave.

The elastic wave device has a small insertion loss and operates efficiently.

DETAIL DESCRIPTION OF PREFERRED EMBODIMENTS

Exemplary Embodiment 1

Figure 1A:
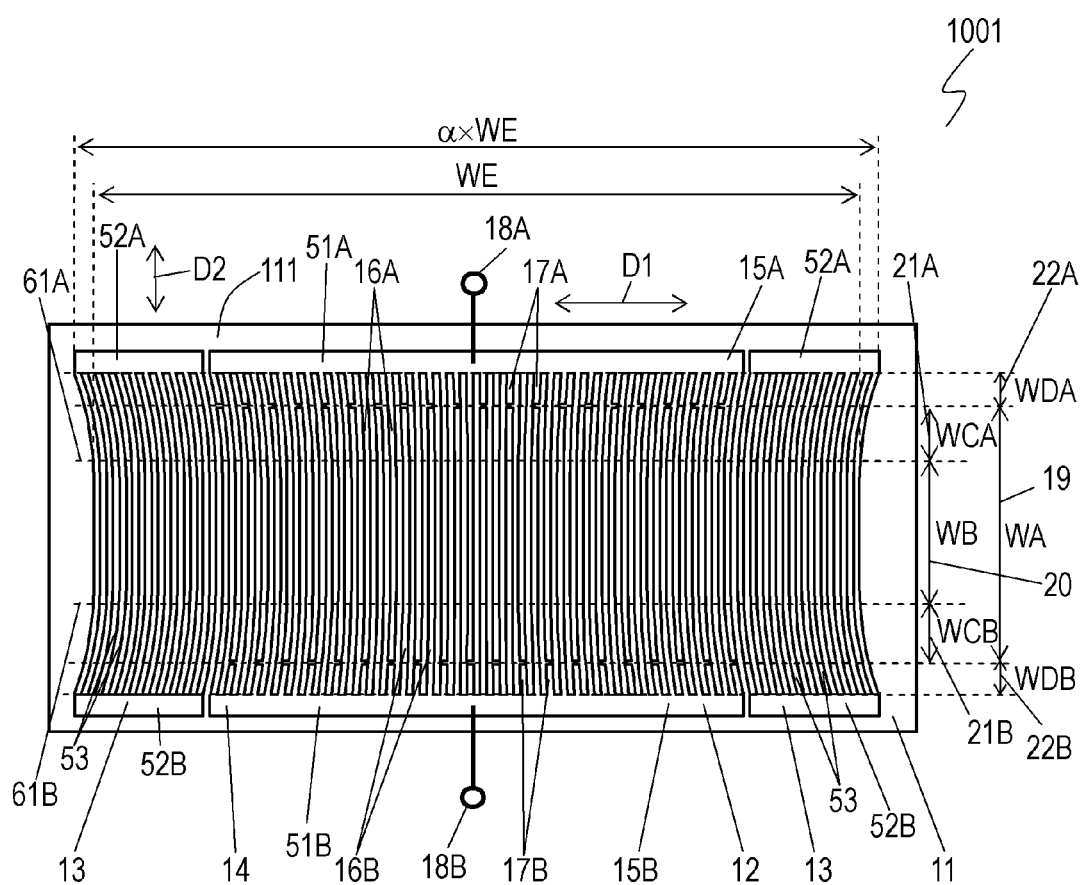
FIG. 1A is an electrode pattern diagram of an elastic wave device in accordance with Exemplary Embodiment 1 of the present invention.
Figure 1B:
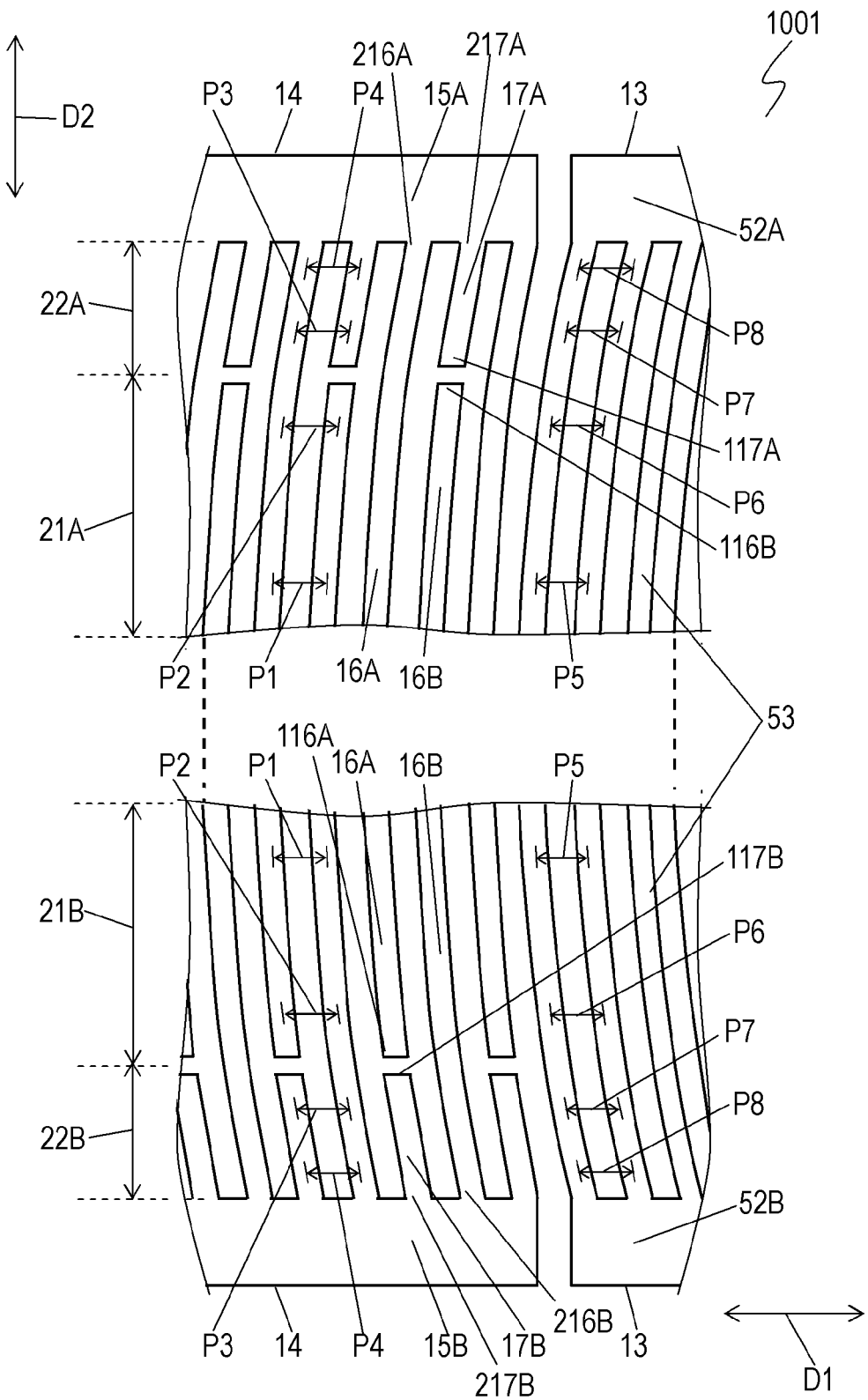
FIG. 1B is an enlarged view of the elastic wave device shown in FIG. 1A.

FIG. 1A is an electrode pattern of elastic wave device 1001 in accordance with Exemplary Embodiment 1 of the present invention. FIG. 1B is an enlarged view of the device. Elastic wave device 1001 includes piezoelectric substrate 11 made of rotated Y-cut and X-propagating lithium tantalate monocrystal, and elastic wave resonator 12 provided on surface 111 of piezoelectric substrate 11. Elastic wave resonator 12 constitutes a one-terminal-pair resonator which includes a pair of reflecting electrodes 13 and comb-shaped electrode pair 14 disposed between reflecting electrodes 13. Comb-shaped electrode pair 14 excites an elastic wave. The pair of reflecting electrodes 13 and comb-shaped electrode pair 14 are arranged along propagating direction D1 of the elastic wave, so that they can trap energy of the elastic wave on piezoelectric substrate 11. Comb-shaped electrode pair 14 includes comb-shaped electrodes 51A and 51B interdigitating with each other. Comb-shaped electrode 51A includes common electrode (busbar) 15A, plural interdigital electrode fingers 16A connected to common electrode 15A, and plural dummy electrode fingers 17A connected to common electrode 15A. Comb-shaped electrode 51B includes common electrode (busbar) 15B extending in parallel with common electrode 15A, plural interdigital electrode fingers 16B connected to common electrode 15B, and plural dummy electrode fingers 17B connected to common electrode 15B. Plural interdigital electrode fingers 16A and 16B interdigitate with each other in interdigital region 19. As shown in FIG. 1B, each of interdigital electrode fingers 16A has end 216A connected to common electrode 15A and tip 116A opposite to end 216A while each of interdigital electrode fingers 16B has end 216B connected to common electrode 15B and tip 116B opposite to end 216B. Each one of dummy electrode fingers 17A has end 217A connected to common electrode 15A and tip 117A opposite to end 217A. Each one of dummy electrode fingers 17B has end 217B connected to common electrode 15B and tip 117B opposite to end 217B. Tip 116A of interdigital electrode finger 16A faces tip 117B of dummy electrode finger 17B while tip 116B of interdigital electrode finger 16B faces tip 117A of dummy electrode finger 17A.

As shown in FIG. 1A, in comb-shaped electrode pair 14, interdigital region 19 in which interdigital electrode fingers 16A and 16B interdigitate with each other, has width WA along direction D2 perpendicular to direction D1. No electrode 16A interdigitates with electrode 16B but dummy electrode fingers 17A are disposed in dummy region 22A. Dummy region 22A has width WDA along direction D2. No electrode 16A interdigitates with electrodes 16B but dummy electrode fingers 17B are disposed in dummy region 22B. Dummy region 22B has width WDB along direction D2. According to Embodiment 1, width WDA is equal to width WDB. Both ports of comb-shaped electrode pair 14, namely, common electrodes 15A and 15B are connected to input-output terminals 18A and 18B, respectively.

Reflecting electrode 13 includes common electrodes 52A and 52B extending in parallel with common electrodes 15A and 15B, plural reflecting electrode fingers 53 disposed between common electrodes 52A and 52B. Plural reflecting electrode fingers 53 are connected to common electrodes 52A and 52B, and arranged in direction D1.

Center region 20 and side regions 21A, 21B are provided in interdigital region 19 of comb-shaped electrode pair 14 and reflecting electrodes 13. Center region 20 extends along direction D1 at the center between common electrodes 15A and 15B and at the center between common electrodes 52A and 52B. Side region 21A is adjacent to center region 20 in direction D2 and faces common electrodes 15A and 52A. Side region 21B is adjacent to center region 20 in direction D2 and faces common electrodes 15B and 52B. Center region 20 has width WB in direction D2, and side regions 21A and 21B have widths WCA and WCB in direction D2, respectively. According to Embodiment 1, width WCA is equal to width WCB.

A distance in direction D1 between respective centers of two adjacent electrode fingers out of interdigital electrode fingers 16A and 16B of comb-shaped electrode pair 14, reflecting electrodes 13, dummy electrode fingers 17A and 17B, and reflecting electrode fingers 53 is defined as a pitch of the electrode fingers. In center region 20, a pitch of electrode fingers 16A, 16B, 17A, 17B, and 53 is constant along direction D2; however, the pitch in center region 20 may change gradually along in direction D1 in which the elastic wave propagates. This structure efficiently reduces loss of elastic wave energy, thus improving electrical characteristics of elastic wave device 1001.

Side regions 21A, 21B are adjacent to center region 20 in direction D2, and located at positions opposite to each other. In side regions 21A and 21B, each pitch of the electrode fingers becomes wider gradually as located away from center region 20.

Dummy region 22A is located between side region 21A and common electrode 15A, and has dummy electrode fingers 17A disposed therein. Dummy region 22B is located between side region 21B and common electrode 15B, and has dummy electrode fingers 17B disposed therein. In dummy region 22A, the pitch which is the distance between the center of interdigital electrode finger 16A and the center of dummy electrode finger 17A adjacent to each other becomes wider gradually as located away from center region 20. Similarly, a pitch which is the distance between the center of interdigital electrode finger 16B and the center of dummy electrode finger 17B adjacent to each other becomes wider gradually as away from center region 20.

As shown in FIG. 1B, pitches P1 and P2 are the distances in direction D1 between respective centers of interdigital electrode fingers 16A and 16B adjacent to each other in side regions 21A and 21B. The position of pitch P2 is farther from center region 20 than the position of pitch P1 is. Pitches P3 and P4 are the distances in direction D1 between respective centers of interdigital electrode finger 16A and dummy electrode finger 17A adjacent to each other in dummy region 22A, and they are also the distances in direction D1 between respective centers of interdigital electrode finger 16B and dummy electrode finger 17B adjacent to each other in dummy region 22B. The position of pitch P3 is farther from center region 20 than the position of pitch P2 is. The position of pitch P4 is farther from center region 20 than the position of pitch P3 is. Pitches P1, P2, P3, and P4 become wider in this order. Namely, pitch P2 is wider than pitch P1, and pitch P3 is wider than pitch P2, and pitch P4 is wider than pitch P3.

As shown in FIG. 1B, pitches P5 to P8 are the distances in direction D1 between the respective centers of each one of plural reflecting electrode fingers 53 adjacent to each other. Pitches P5 to P8 are farther from center region 20 in this order. Namely, the position of pitch P6 is farther from center region 20 than the position of pitch P5 is. The position of pitch P7 is farther from the center region 20 than the position of pitch P6 is. The position of pitch P8 is farther from the center region 20 than the position of pitch P7 is. Pitches P5, P6, P7 and P8 become wider in this order. Namely, pitch P7 is wider than pitch P6, and pitch P8 is wider than pitch P7. Center region 20, side regions 21A and 21B extend in parallel to common electrodes 51A, 51B, 52A, and 52B across comb-shaped electrode pair 14 and two reflecting electrodes 13.

In a gap between tip 116A of electrode finger 16A and tip 117B of dummy electrode finger 17B, and in a gap between tip 116B of electrode finger 16B and tip 117A of dummy electrode finger 17A, the pitch in direction D1 between electrode fingers 16A and 16B is measured as the distance between lines extending into the gaps along respective centers of electrode fingers 16A and 16B.

In elastic wave device 1001 in accordance with Embodiment 1, the width (WA+WDA+WDB) in direction D2 between common electrodes 15A and 15B is 45 μm. Each of widths WDA and WDB of dummy regions 22A and 22B is 2.5 μm. The gap between tip 116A of electrode finger 16A and tip 117B of dummy electrode finger 17B is 0.5 μm in direction D2. The pitch of interdigital electrode fingers 16A and 16B in center region 20 is 1 μm. Width WA of interdigital region 19 in which interdigital electrode fingers 16A and 16B interdigitate with each other is 40 μm.

The electrode fingers extend along a continuous and smooth curved line from boundary 61A (61B) between center region 20 and side region 21A (21B) to common electrodes 15A and 52A (15B, 52B). According Embodiment 1, the pitch of between the electrode fingers of comb-shaped electrode pair 14 and reflecting electrodes 13 changes according to a quadratic function of a distance from boundary 61A (61B) in direction D2 by a changing amount increasing as approaching common electrodes 15A, 15B, 52A and 52B. The ratio of the width of the electrode fingers to the pitch of the electrode fingers is ½ in any of center region 20, side regions 21A and 21B, and dummy regions 22A and 22B.

Center region 20 functions as a main exciting region of elastic wave resonator 12. In center region 20, the distance in direction D1 between respective centers of two adjacent interdigital electrode fingers 16A of comb-shaped electrode 51A is defined as cycle λ. Cycle λ is a wavelength of the elastic wave in propagating direction D1 excited by comb-shaped electrode pair 14. In center region 20, the distance in direction D1 between respective centers of two adjacent interdigital electrode fingers 16B of other comb-shaped electrode 51B is also cycle λ. Pitch P0 in direction D1 between respective centers of two adjacent interdigital electrode fingers 16A and 16B in center region 20 is λ/2. The ratio of a pitch at ends 216A and 216B connected respectively with common electrodes 15A and 15B to pitch P0 in center region 20 is defined as expansion ratio α. While elastic resonator 12 in center region 20 has width WE in propagation direction D1, elastic resonator 12 at ends 216A and 216B of interdigital electrode fingers 16A and 16B has width (α×WE) in propagation direction D1. Interdigital electrode finger 16A is not connected to common electrode 15B, thus being located away from common electrode 15B. Interdigital electrode finger 16B is not connected to common electrode 15A, thus being located away from common electrode 15A. The pitch of interdigital electrode fingers 16A and 16B at ends 216A and 216B is actually a half of the distance in direction D1 between respective centers of ends 216A of two adjacent interdigital electrode fingers 16A of comb-shaped electrode 51A. The pitch of interdigital electrode fingers 16A and 16B at ends 216A and 216B is actually a half of the distance in direction D1 between respective centers of ends 216B of two adjacent interdigital electrode fingers 16B of the other comb-shaped electrode 51B.

Figure 2A:
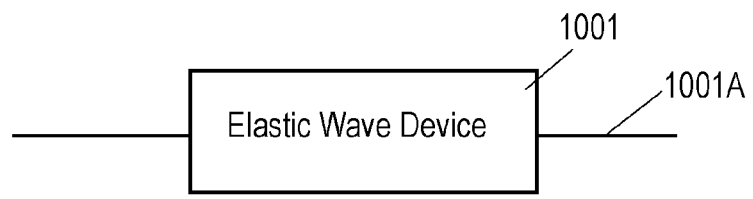
FIG. 2A is a circuit diagram of an evaluation circuit of the elastic wave device in accordance with Embodiment 1.

Appropriate ranges of expansion ratio α of the electrode fingers and widths WCA and WCB will be discussed below. FIG. 2A is a circuit diagram of an evaluation circuit for evaluating elastic wave device 1001 as a series resonator which is connected in series to signal path 1001A.

Figure 2B:
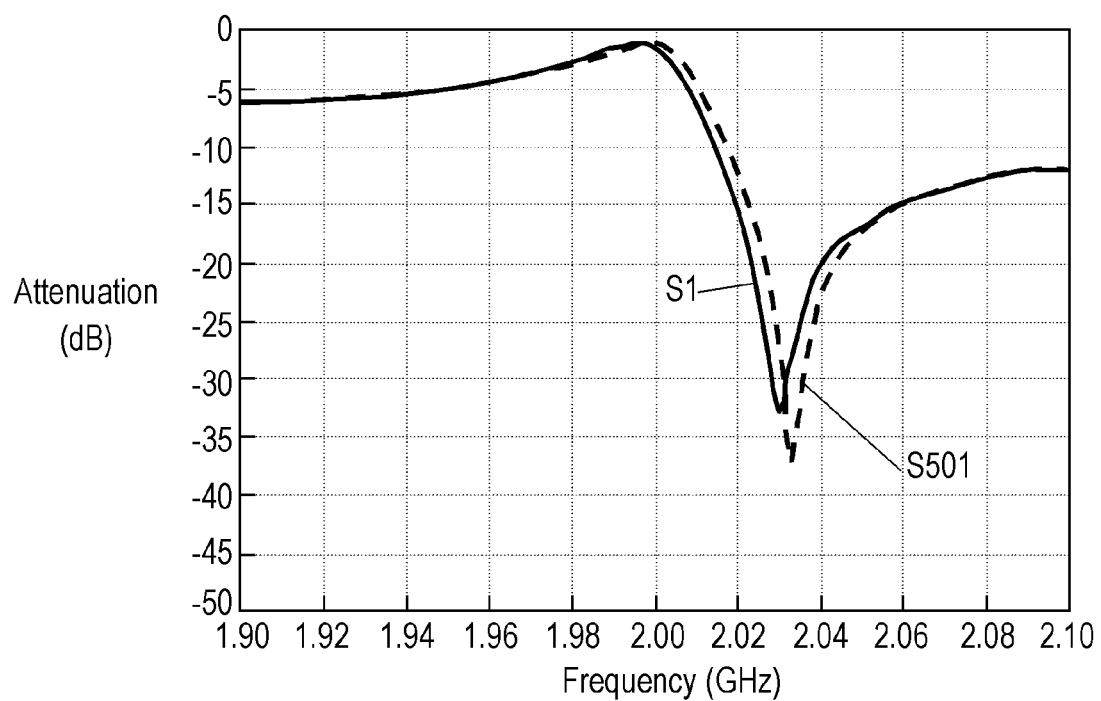
FIG. 2B shows propagation characteristics of the elastic wave device in accordance with Embodiment 1.
Figure 3A:
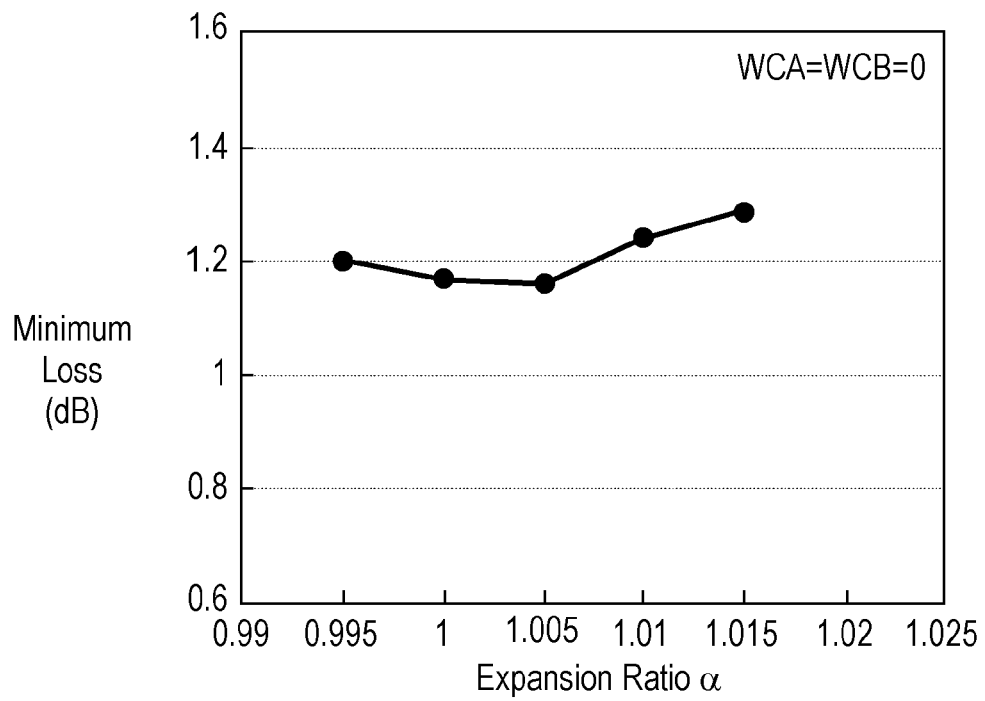
FIG. 3A shows minimum loss characteristics of the elastic wave device in accordance with Embodiment 1 while the device is used as a series resonator having a side region having a width of 0.
Figure 3B:
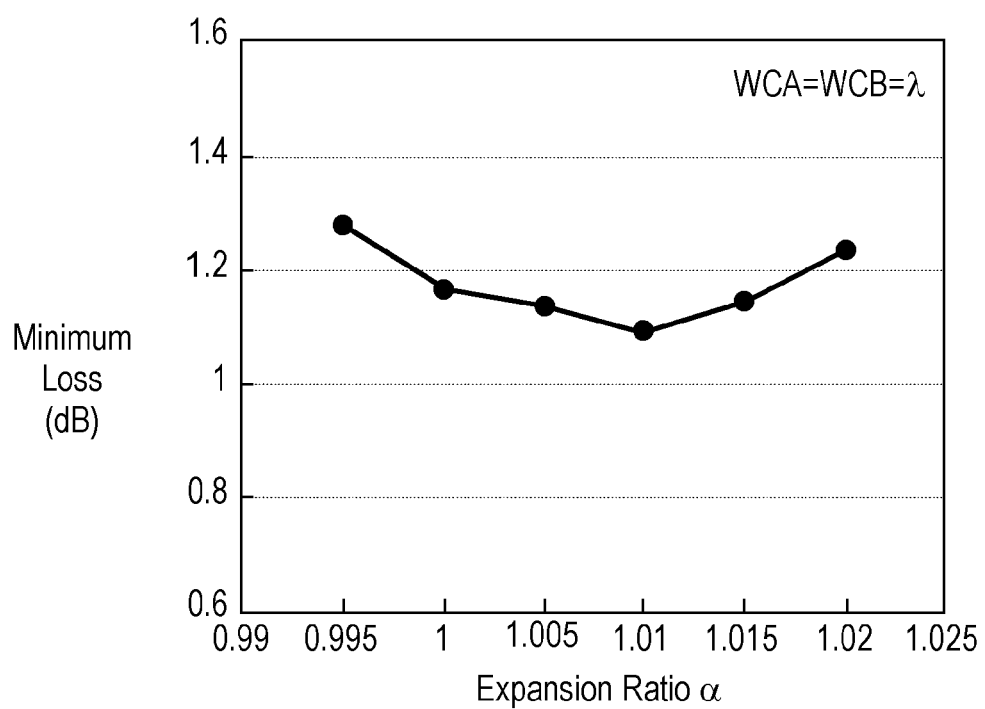
FIG. 3B shows minimum loss characteristics of the elastic wave device in accordance with Embodiment 1 while the device is used as a series resonator having a side region having a width of one wavelength of elastic wave.
Figure 3C:
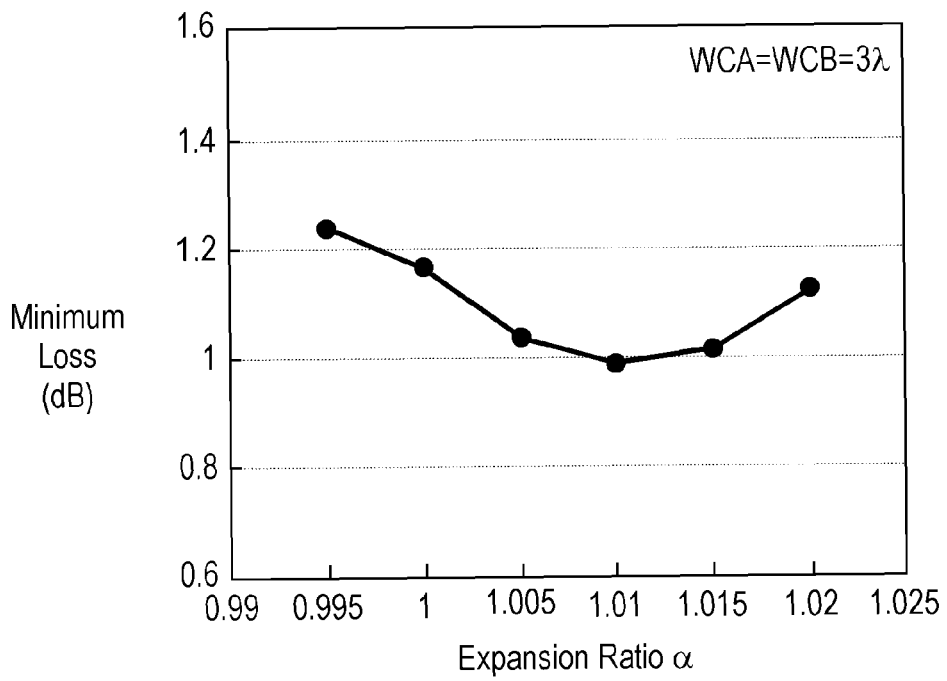
FIG. 3C shows minimum loss characteristics of the elastic wave device in accordance with Embodiment 1 while and the device is used as a series resonator having a side region having a width of three times of the wavelength of the elastic wave.
Figure 3D:
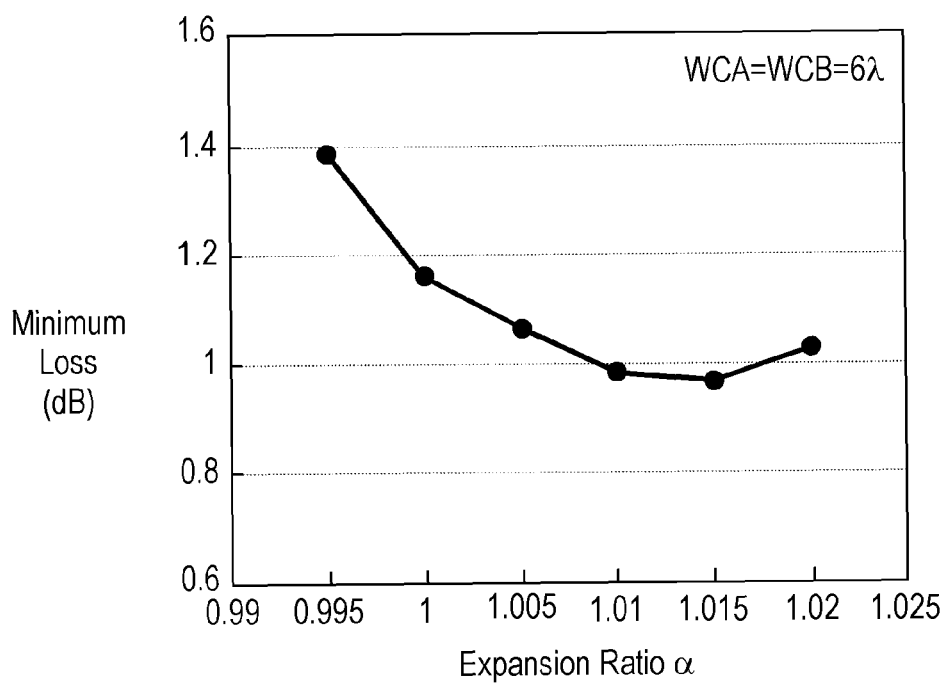
FIG. 3D shows minimum loss characteristics of the elastic wave device in accordance with Embodiment 1 while the device is used as a series resonator having a side region having a width of six times of the wavelength of the elastic wave.
Figure 3E:
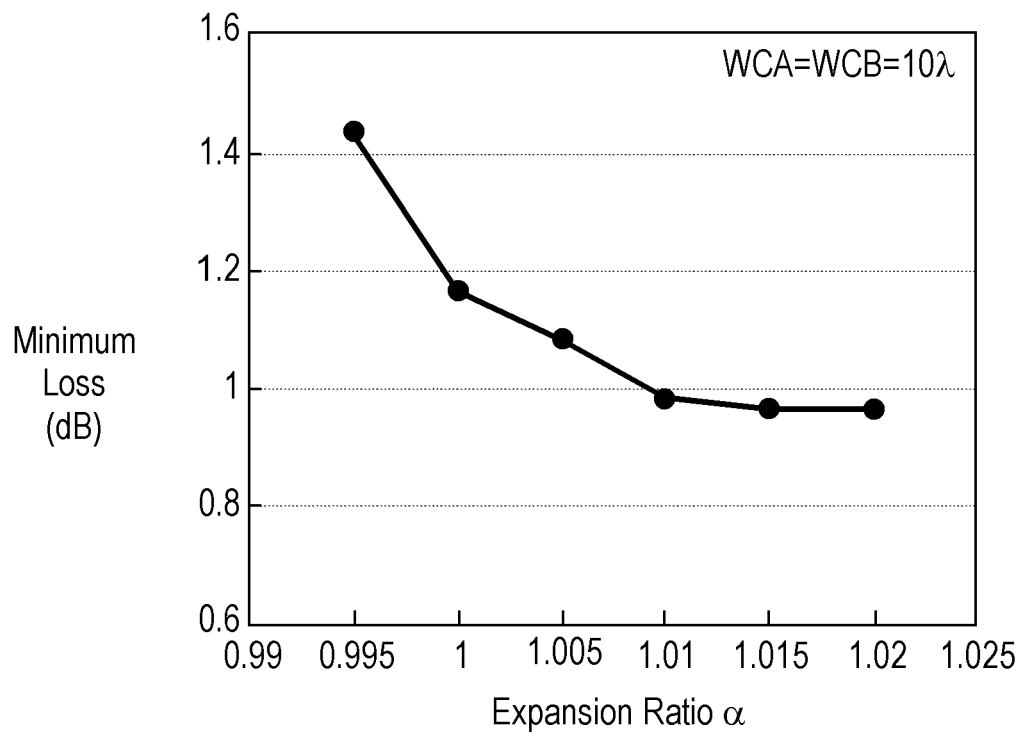
FIG. 3E shows minimum loss characteristics of the elastic wave device in accordance with Embodiment 1 while the device is used as a series resonator having a side region having a width of ten times of the wavelength of the elastic wave.

FIG. 2B shows propagation characteristics of elastic wave device 1001 in accordance with Embodiment 1 in which elastic wave resonator 12 is connected in series to signal path 1001A as a series resonator. For the evaluation purpose, both ports of resonator 12 are connected to capacitive elements which are grounded. In FIG. 2B, the horizontal axis represents a frequency of a signal, and the vertical axis represents attenuation of the signal. Propagation profile S501 shows the characteristics of a comparative example having expansion ratio α of 1. Propagation profile S1 shows the characteristics of elastic wave device 1001 having expansion ratio α of 1.01 while widths WCA and WCB of side regions 21A and 21B are 3λ. Elastic wave device 1001 as a series resonator having expansion ratio α of 1.01 and widths WCA and WCB of 3λ provides an insertion loss smaller, by an amount slightly more than 0.2 dB, than the comparative example having expansion ratio α of 1.

Next, expansion ratio α of the pitch of the electrode fingers is evaluated within a range from 0.995 to 1.020 and the widths WCA, and WCB of side regions 21A, 21B are evaluated within a range from 0 to 10λ to obtain the propagation characteristics of the series resonator for evaluating the insertion loss of elastic wave device 1001. To be more specific, the insertion loss of elastic wave device 1001 is measured by changing the frequency of the signal to find a minimum loss from the measured insertion loss.

FIGS. 3A to 3E show the characteristics of minimum insertion loss of elastic wave resonator 12 of elastic wave device 1001 used as a series resonator. The minimum insertion loss is measured for various values of widths WCA, WCB of side regions 21A, 21B. In FIGS. 3A to 3E, the horizontal axis represents expansion ratio α of the pitch, and the vertical axis represents the minimum insertion loss. Width WCA (WCB) of side region 21A (21B) takes values of 0, λ, 3λ, 6λ, and 10λ in FIGS. 3A, 3B, 3C, 3D, and 3E, respectively. The comparative example has expansion ratio α of 1 and widths WCA and WCB of side regions 21A, 21B of 0.

As shown in FIG. 3A to 3E, when elastic wave resonator 12 is used as a series resonator, the insertion loss can be reduced when expansion ratio α is not smaller than 1.005, and each of widths WCA and WCB of side regions 21A and 21B is not smaller than λ. Total evaluation of the propagation characteristics finds that the insertion loss can be reduced when expansion ratio α ranges from 1.005 to 1.015, and each of width WCA and WCB of side regions 21A and 21B ranges from λ to 6π. These ranges provide excellent propagation characteristics.

As discussed above, elastic wave resonator 12 connected in series to signal path 1001A as a series resonator having expansion ratio α and widths WCA and WCB within the above ranges decreases the insertion loss.

Figure 4A:
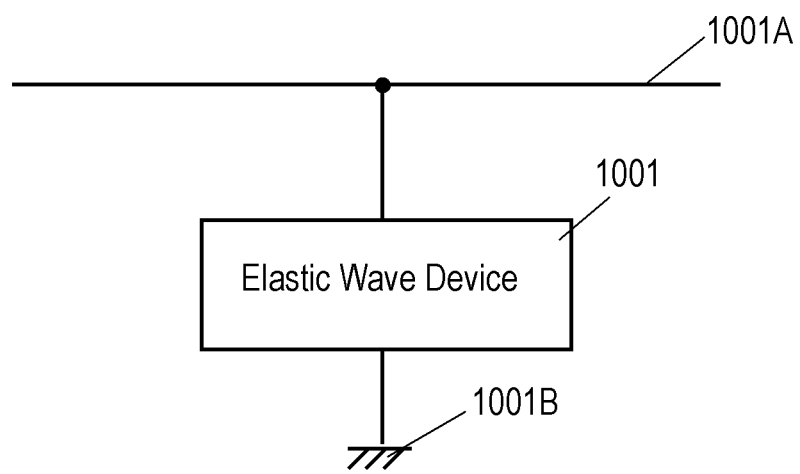
FIG. 4A is a circuit diagram of an evaluation circuit of the elastic wave device in accordance with Embodiment 1.
Figure 4B:
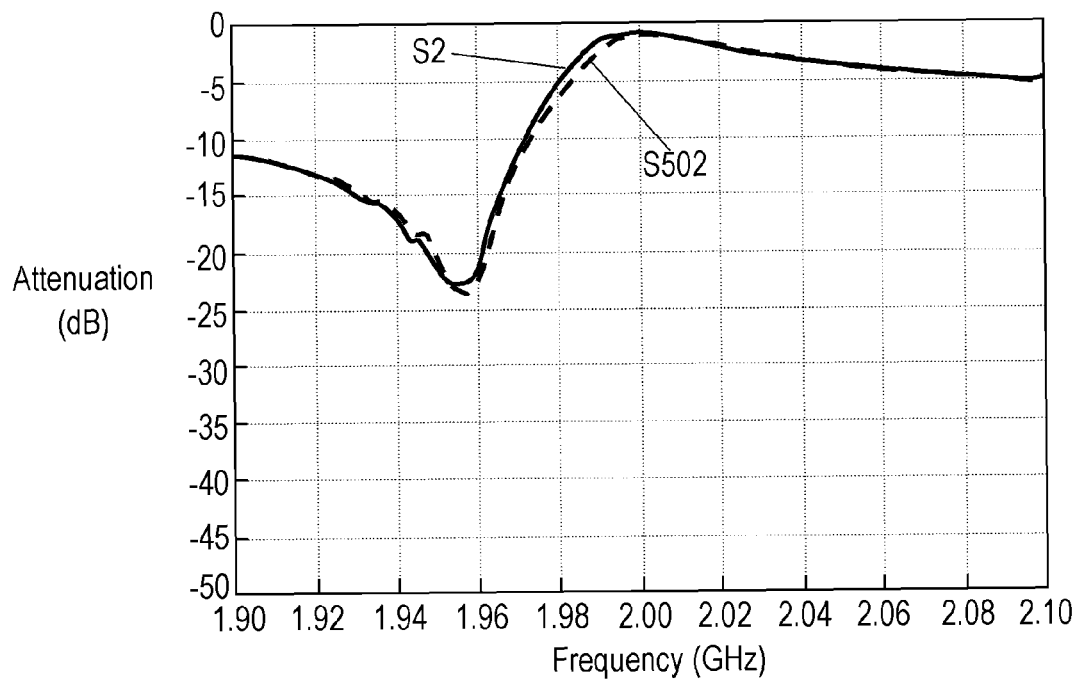
FIG. 4B shows propagation characteristics of the elastic wave device in accordance with Embodiment 1.

FIG. 4A is a circuit diagram of an evaluation circuit of elastic wave device 1001 used as a parallel resonator connected between signal path 1001A and ground 1001B. The evaluation result of the characteristics of device 1001 will be described below:

FIG. 4B shows the propagation characteristics of elastic wave device 1001 in accordance with Embodiment 1 in which elastic wave resonator 12 is connected between signal path 1001A and ground 1001B as a parallel resonator. For the evaluation purpose, each of both ports of resonator 12 is connected to a capacitive element which is grounded. In FIG. 4B, the horizontal axis represents a frequency of a signal, and the vertical axis represents attenuation of the signal. Propagation profile S502 shows the characteristics of a comparative example having expansion ratio α of 1. Propagation profile S2 shows the characteristics of elastic wave device 1001 having expansion ratio α of 1.01 and widths WCA and WCB of side regions 21A and 21B of 3λ. Elastic wave device 1001 as a parallel resonator having expansion ratio α of 1.01 and widths WCA and WCB of 3λ has a smaller insertion loss reduced by 0.1 dB than the comparative example having expansion ratio α of 1.

Next, expansion ratio α of the pitch of the electrode fingers is evaluated within a range from 0.995 to 1.020, and the widths WCA and WCB of side regions 21A, 21B are evaluated within a range from 0 to 10λ to obtain the propagation characteristics of the parallel resonator for evaluating the insertion loss of elastic wave device 1001. To be more specific, the insertion loss of elastic wave device 1001 is measured while changing the frequency of the signal to measure a minimum loss from the measured insertion losses.

FIGS. 5A to 5E show the characteristics of the minimum insertion loss of elastic wave resonator 12 of elastic wave device 1001 used as a series resonator. The minimum insertion loss is measured for various values of widths WCA and WCB of side regions 21A and 21B. In FIGS. 5A to 5E, the horizontal axis represents expansion ratio α of the pitch, and the vertical axis represents the minimum insertion loss. Width WCA (WCB) of side region 21A (21B) takes values of 0, λ, 3λ, 6λ, and 10λ in FIGS. 5A, 5B, 5C, 5D, and 5E, respectively. The comparative example takes a value of expansion ratio α of 1 and each of widths WCA and WCB of side regions 21A and 21B of 0.

As shown in FIG. 5A to 5E, when elastic wave resonator 12 is used as a parallel resonator, the insertion loss can be reduced effectively with expansion ratio α not smaller than 1.005, and the insertion loss can be reduced with each of widths WCA and WCB of side regions 21A, 21B not smaller than λ. For total evaluation of the propagation characteristics, the insertion loss can be reduced when expansion ratio α ranges from 1.01 to 1.015. The insertion loss becomes particularly small when each of widths WCA and WCB of side regions 21A and 21B ranges from λ to 6λ. These ranges provide excellent propagation characteristics.

As discussed above, elastic wave resonator 12 connected between signal path 1001A and ground 1001B as a parallel resonator having expansion ratio α widths WCA and WCB in the above ranges decreases the insertion loss.

As discussed above, side regions 21A and 21B in which the pitch of the electrode fingers becomes wider gradually as located away from center region 20, thereby decreasing the insertion loss of elastic wave resonator 12.

Piezoelectric substrate 11 is made of piezoelectric monocrystal, such as rotated Y-cut and X-propagating lithium tantalate mono-crystal, having a concave reciprocal velocity plane of elastic wave. In elastic wave resonator 12 employing piezoelectric substrate 11, the pitch of the electrode fingers within side regions 21A and 21B becomes wider gradually as located away from center region 20 functioning as a main exciting region. This structure allows the velocity of the elastic wave in side regions 21A and 21B to be slower than that in center region 20 functioning as the main exciting region. This mechanism allows the energy of resonating elastic wave to be trapped within a guided-wave path of the elastic wave, thereby reducing energy loss and the insertion loss.

In order to trap the energy within a guided-wave path by making a velocity of the elastic wave in both sides of the main exciting region than a velocity in the main exciting region, a ratio of a width of each of electrode fingers 16A, 16B, 17A, and 17B to the pitch of electrode fingers 16A, 16B, 17A, and 17B in dummy regions 22A and 22B can be increased, or the pitch of the electrode fingers in dummy regions 22A and 22B can be increased. However, in the case that the ratio of the width to the pitch is increased, if the electrode fingers are thin and arranged densely, the electrode fingers may touch each other even after the dingers are etched, thus being prevented from being formed. This method is thus limited to an elastic wave device that includes electrode fingers arranged at a low density. In the case that the pitch of the electrode fingers are increased in dummy regions 22A and 22B, a large number of electrode fingers accumulate differences between the pitch in dummy regions 22A and 22B, and cause a large deviation. This may provide discontinuity between interdigital region 19 and dummy regions 22A and 22B, and disperse the elastic wave, thus causing the energy of the elastic wave to be lost. In the case that the electrode fingers are thin, elastic wave device 1001 in accordance with Embodiment 1 can reduce the insertion loss without lowering the yield rate of electrode pattern.

In elastic wave device 1001 in accordance with Embodiment 1, electrode fingers 16A, 16B, 17A, and 17B in side regions 21A, 21B and dummy regions 22A, 22B extend along continuous and smooth curved lines. Interdigital electrode fingers 16A and 16B in side regions 21A, 21B and center region 20 extend along continuous and smooth curved lines. This structure eliminates discontinuous steps between electrode fingers 16A and 16B at positions where center region 20 is connected to side regions 21A and 21B and within side regions 21A and 21B, thereby reducing dispersion loss of the elastic wave at these discontinuous positions, and reducing the insertion loss.

Figure 5A:
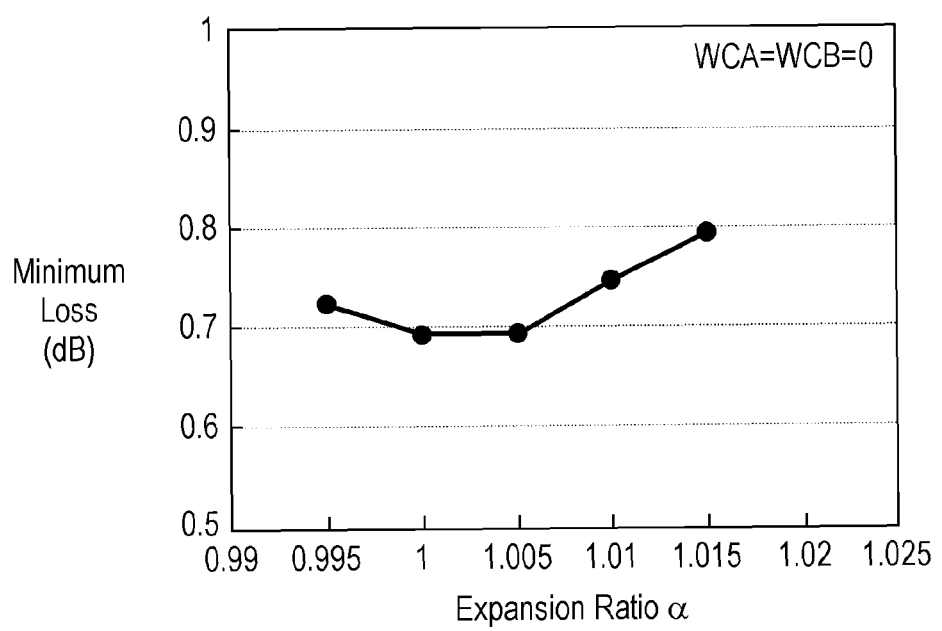
FIG. 5A shows minimum loss characteristics of the elastic wave device in accordance with Embodiment 1 while the device is used as a parallel resonator having a side region having a width of 0.
Figure 5B:
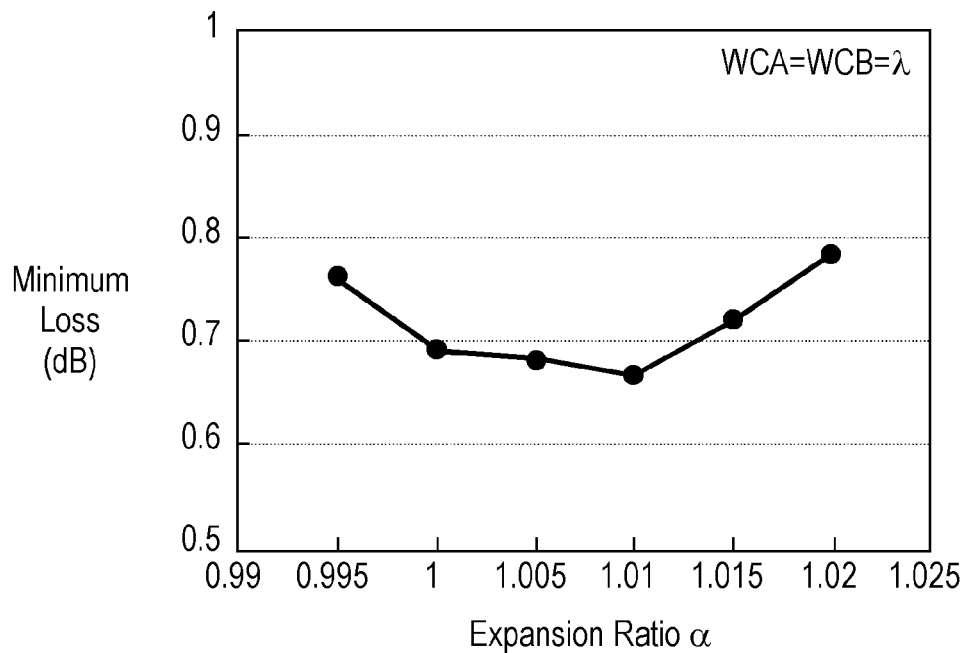
FIG. 5B shows minimum loss characteristics of the elastic wave device in accordance with Embodiment 1 while the device is used as a parallel resonator having a side region having a width of one wavelength of elastic wave.
Figure 5C:
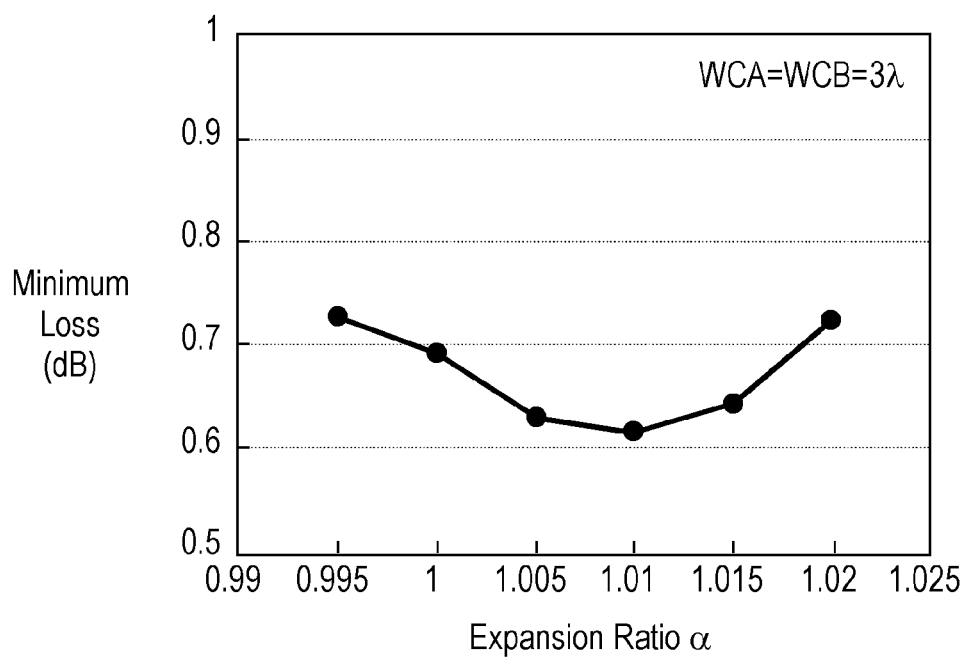
FIG. 5C shows minimum loss characteristics of the elastic wave device in accordance with Embodiment 1 while the device is used as a parallel resonator having a side region having a width of three times of a wavelength of the elastic wave.
Figure 5D:
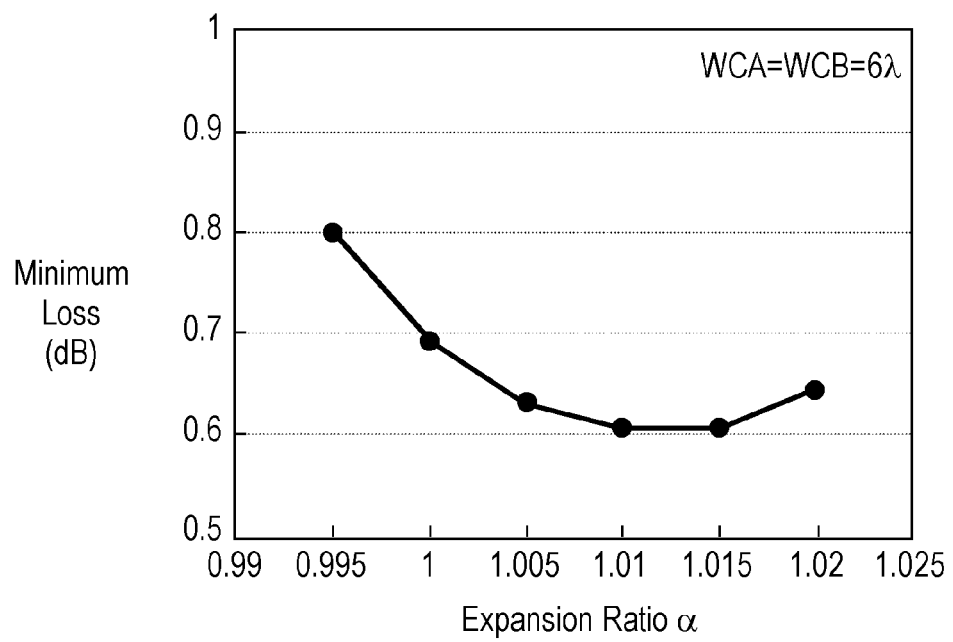
FIG. 5D shows minimum loss characteristics of the elastic wave device in accordance with Embodiment 1 while the device is used as a parallel resonator having a side region having a width of six times of the wavelength of the elastic wave.
Figure 5E:
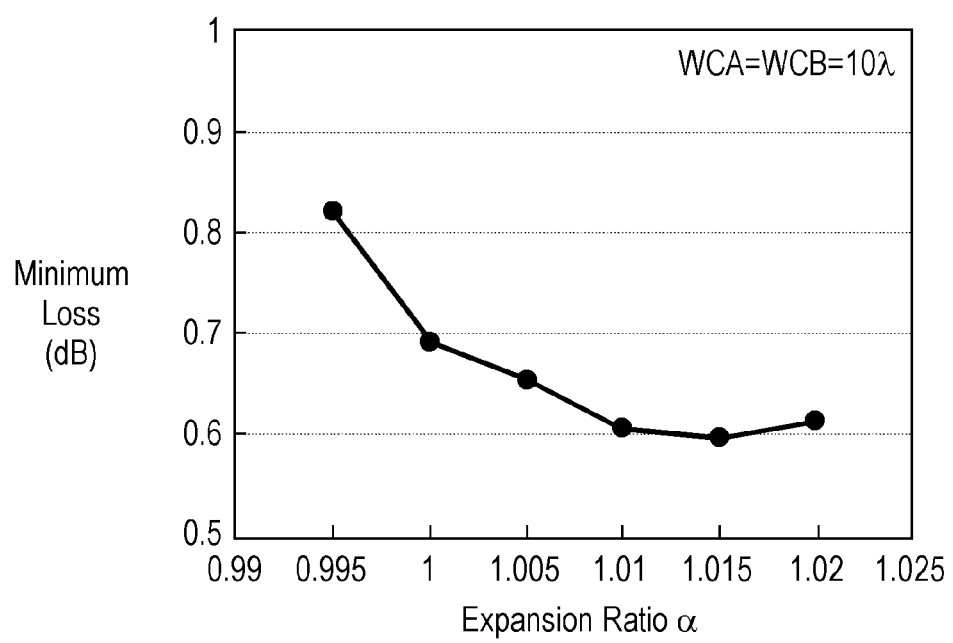
FIG. 5E shows minimum loss characteristics of the elastic wave device in accordance with Embodiment 1 while the device is used as a parallel resonator having a side region having a width of ten times of the wavelength of the elastic wave.
Figure 5F:
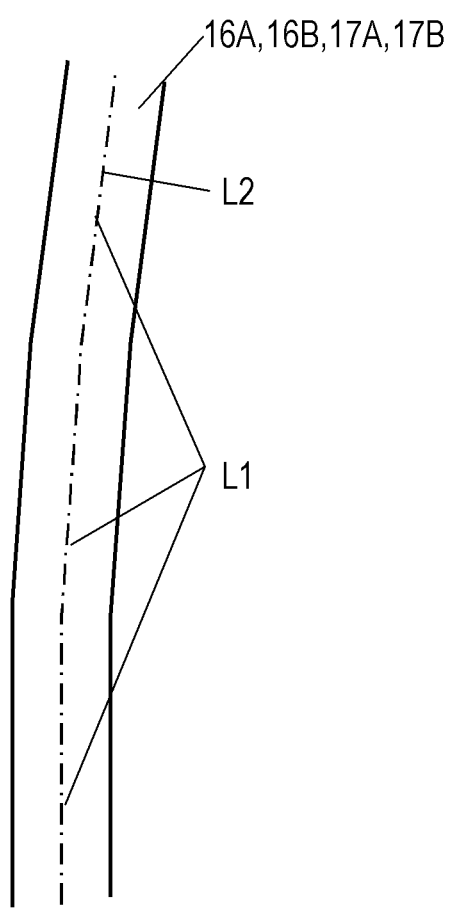
FIG. 5F is an enlarged view of another electrode finger of the elastic wave device in accordance with Embodiment 1.

FIG. 5F is an enlarged view of another example of electrode fingers 16A, 16B, 17A, and 17B of elastic wave device 1001 in accordance with Embodiment 1. In FIGS. 1A and 2B, electrode fingers 16A and 16B extend along continuous and smooth curved lines in side regions 21A, 21B and dummy regions 22A, 22B. However, as shown in FIG. 5F, electrode fingers 16A, 16B, 17A, and 17B can extend along approximate curved line L2 including plural straight lines L1 connected to each other, providing effects similar to the structure discussed above.

In elastic wave device 1001 in accordance with Embodiment 1, interdigital electrode fingers 16A and 16B in center region 20 have pitch P0 between electrode fingers 16A and 16B while electrode fingers 16A and 16B have the maximum pitch not smaller than 1.005×P0 between electrode fingers 16A and 16B in side regions 21A and 21B and dummy regions 22A and 22B. This structure efficiently suppresses the energy loss of the elastic wave, thus improving the electrical characteristics of elastic wave device 1001.

Interdigital electrode fingers 16A and 16B have pitch P0 between electrode fingers 16A and 16B in center region 20 while electrode fingers 16A and 16B have the maximum pitch not larger than 1.020×P0 in side regions 21A and 21B and dummy regions 22A and 22B. This structure efficiently suppresses the energy loss of the elastic wave, thus improving the electrical characteristics of elastic wave device 1001.

In elastic wave device 1001 in accordance with Embodiment 1, the pitch of the electrode fingers in side regions 21A and 21B and dummy regions 22A and 22B can be not greater than 1.015×P0. This structure efficiently suppresses the energy loss of the elastic wave, thus improving the electrical characteristics of elastic wave device 1001.

In elastic wave device 1001 in accordance with Embodiment 1, widths WCA and WCB of side regions 21A and 21B in direction D2 perpendicular to the propagating direction D1 may be not smaller than λ. This structure efficiently suppresses the energy loss of the elastic wave, thus improving the electrical characteristics of elastic wave device 1001.

When the elastic wave device constitutes a ladder-type filter, at least one of series-arm resonators and parallel arm resonators may be elastic wave resonator 12 according to Embodiment 1, thereby reducing the insertion loss.

Since elastic wave device 1001 in accordance with Embodiment 1 includes piezoelectric substrate 11 made of rotated Y-cut and X-propagating lithium tantalate monocrystal, no lateral mode spurious occurs. The electrode fingers may not necessarily be designed for canceling the lateral mode spurious, such as weighting (apodizing) the interdigital length of electrode fingers or weighting (apodizing) the length of dummy electrode fingers. The apodization is usually employed when quartz crystal or lithium niobate is used.

Material of piezoelectric substrate 11 is not limited to the rotated Y-cut and X-propagating lithium tantalate monocrystal, but any piezoelectric monocrystal having a reciprocal velocity plane which is concave in a direction in which a surface acoustic wave propagates can provide an effect similar to that discussed above.

As discussed above, the reciprocal velocity plane of piezoelectric substrate 11 is concave in propagating direction D1 in which the elastic wave propagates. Elastic wave resonator 12 includes comb-shaped electrode pair 14 including comb-shaped electrodes 51A and 51B which are formed on substrate 11 and which interdigitate with each other. Elastic wave resonator 12 has center region 20 and side regions 21A and 21B. In center region 20, plural interdigital electrode fingers 16A and 16B interdigitate with each other. Pitch of interdigital electrode fingers 16A and 16B are constant along direction D2 perpendicular to propagating direction D1. In side regions 21A and 21B, pitch of interdigital electrode fingers 16A and 16B are is than the pitch in center region 20. This structure allows elastic wave device 1001 to trap the elastic wave in elastic wave resonator 12 efficiently, thus allowing elastic wave device 1001 to work efficiently with a small insertion loss.

Each one of plural interdigital electrode fingers 16A and respective one of plural dummy electrode fingers 17B extend along a line including plural straight lines connected together or a smooth curved line. Each one of plural interdigital electrode fingers 16B and respective one of plural dummy electrode fingers 17A extend along a line including plural straight lines connected together or a smooth curved line.

While interdigital electrode fingers 16A and 16B are arranged at pitch P0 between interdigital electrode fingers 16A and 16B in center region 20, the maximum pitch of plural interdigital electrode fingers 16A and plural dummy electrode fingers 17A is not smaller than 1.005×P0. The maximum pitch of plural interdigital electrode fingers 16B and plural dummy electrode fingers 17B is not smaller than 1.005×P0.

While interdigital electrode fingers 16A and 16B are arranged at pitch P0 between interdigital electrode fingers 16A and 16B in center region 20, the maximum pitch between plural interdigital electrode fingers 16A and plural dummy electrode fingers 17A is not greater than 1.020×P0, and the maximum pitch between plural interdigital electrode fingers 16B and plural dummy electrode fingers 17B is not greater than 1.020×P0.

In side regions 21A and 21B, each of interdigital electrode fingers 16A extends along a continuous curved line or a line including plural straight lines connected together. In side regions 21A and 21B, each of interdigital electrode fingers 16B extends along a continuous curved line or a line including plural straight lines connected together.

Plural interdigital electrode fingers 16A extend along smooth curved lines from side region 21A to center region 20, and plural interdigital electrode fingers 16B extend along smooth curved lines from side region 21B to center region 20.

While interdigital electrode fingers 16A and 16B are arranged at pitch P0 between interdigital electrode fingers 16A and 16B in center region 20, the maximum pitch in side regions 21A and 21B is not smaller than 1.005×P0 and not greater than 1.020×P0.

Exemplary Embodiment 2

Figure 6:
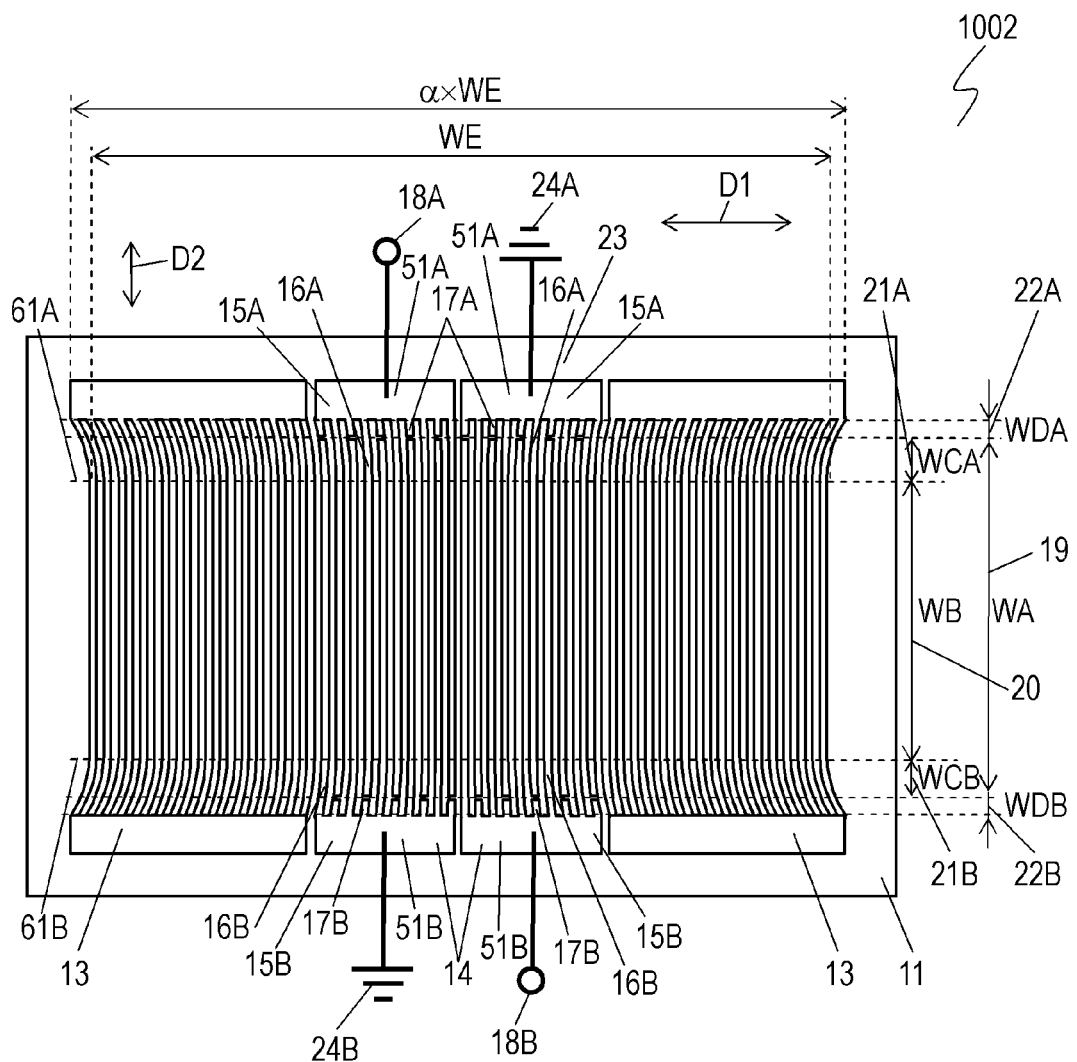
FIG. 6 is an electrode pattern diagram of an elastic wave device in accordance with Exemplary Embodiment 2 of the present invention.

FIG. 6 is an electrode pattern diagram of elastic wave device 1002 in accordance with Exemplary Embodiment 2 of the present invention. In FIG. 6, components identical to those of elastic wave device 1001 in accordance with Embodiment 1 shown in FIG. 1 are denoted by the same reference numerals.

Elastic wave device 1002 in accordance with Embodiment 2 includes dual-terminal-pair resonator 23 of two electrodes type as an elastic wave resonator. Dual-terminal-pair resonator 23 constitutes a longitudinally-coupled resonator type elastic wave filter, and includes two comb-shaped electrode pairs 14 disposed adjacently to each other along propagating direction D1 of the elastic wave.

As shown in FIG. 6, elastic wave device 1002 includes piezoelectric substrate 11 made of rotated Y-cut and X-propagating lithium tantalate monocrystal, and two comb-shaped electrode pairs 14 disposed between a pair of reflecting electrodes 13, thus providing dual-terminal-pair resonator 23 of two electrodes type. Input-output terminal 18A is connected to common electrode 15A of one comb-shaped electrode pair 14 of two comb-shaped electrode pairs 14 while grounding terminal 24B is connected to common electrode 15B of the one comb-shaped electrode pair. Grounding terminal 24A is connected to common electrode 15A of the other comb-shaped electrode pair 14 of the two comb-shaped electrode pairs 14 while input-output terminal 18B is connected to common electrode 15B of the other comb-shaped electrode pair 14.

Center region 20 and side regions 21A and 21B are provided in interdigital region 19 of comb-shaped electrode pairs 14 and reflecting electrodes 13. Center region 20 has width WB in direction D2 perpendicular to propagating direction D1 of the elastic wave, and side regions 21A and 21B have width WCA and WCB in direction D2, respectively.

A pitch which is the distance in direction D1 between a center of electrode finger 16A and a center of electrode finger 16B adjacent to each other is constant along direction D2. Side regions 21A and 21B are provided on both sides of center region 20 in direction D2. The pitch of electrode fingers 16A and 16B in side regions 21A and 21B is wider than the pitch in center region 20, and become wider gradually as located away from center region 20.

In dummy regions 22A and 22B, a pitch which is a distance in direction D1 between respective centers of any two adjacent electrode fingers of interdigital electrode fingers 16A and 16B and dummy electrode fingers 17A and 17B is wider than the pitch in side regions 21A and 21B, and becomes wider gradually as located away from side regions 21A and 21B.

In dual-terminal-pair resonator 23 in accordance with Embodiment 2, width WA in direction D2 of interdigital region 19 in which interdigital electrode fingers 16A and 16B interdigitate with each other is 40 µm, and the distance (WA+WDA+WDB) between common electrodes 15A and 15B is 45 µm. Pitch P0 of interdigital electrode fingers 16A and 16B in center region 20 is 1 µm. An elastic wave device includes dummy regions 22A and 22B, namely, dummy electrode fingers 17A and 17B, is compared with another elastic wave device that has no dummy electrode finger 17A or 17B. The elastic wave device has dummy regions 22A and 22B having widths WDA and WDB in direction D2 of 2.5 µm. The gap between the tip of electrode finger 16A and the tip of dummy electrode finger 17B is 0.5 µm, and the gap between the tip of electrode finger 16B and the tip of dummy electrode finger 17A is 0.5 µm. On the other hand, in the elastic wave device without dummy regions or dummy electrode finger 17A or 17B, a gap between interdigital electrode finger 16A and common electrode 15B, and a gap between interdigital electrode finger 16B and common electrode 15A are 0.5 µm.

The fingers of comb-shaped electrode pairs 14 and reflecting electrodes 13 extend along continuous curved lines from center region 20 to common electrodes 15A and 15B. According to Embodiment 2, the pitch of the electrode fingers changes according to a quadratic function of a distance from center region 20 by a changing amount increasing as approaching common electrodes 15A and 15B. The ratio of a width of the electrode fingers to the pitch of the electrode fingers is ½ in any of center region 20, side regions 21A and 21B, and dummy regions 22A and 22B.

Center region 20 functions as a main exciting region for dual-terminal-pair resonator 23. In center region 20, the distance in direction D1 between respective centers of two adjacent interdigital electrode fingers 16A of comb-shaped electrode 51A is defined as cycle λ. In center region 20, the distance in direction D1 between respective centers of two adjacent interdigital electrode fingers 16B of the other comb-shaped electrode 51B is defined also as cycle λ. Pitch P0 in direction D1 between respective centers of two adjacent interdigital electrode fingers 16A and 16B in center region 20 is λ/2. The ratio of the pitch at end 216A and end 216B (shown in FIG. 1B) connected respectively to common electrodes 15A and 15B to the pitch in center region 20 is defined as expansion ratio α. While dual-terminal-pair resonator 23 has width WE in propagation direction D1 in center region 20, the width of dual-terminal-pair resonator 23 in propagating direction D1 at positions where ends 216A and 216B of electrode fingers 16A and 16B and ends 217A and 217B of dummy electrode fingers 17A and 17B are connected to common electrodes 15A and 15B is expressed as α×WE. Interdigital electrode finger 16A is not connected to common electrode 15B, thus being located away from common electrode 15B. Interdigital electrode finger 16B is not connected to common electrode 15A, thus being located away from common electrode 15A. The pitch of interdigital electrode fingers 16A and 16B at respective ends 216A and 216B is actually a half of the distance in direction D1 between respective centers of ends 216A of two adjacent interdigital electrode fingers 16A of comb-shaped electrode 51A, and actually a half of the distance in direction D1 between respective centers of ends 216B of two adjacent interdigital electrode fingers 16B of the other comb-shaped electrode 51B.

An appropriate range for expansion ratio α of the pitch is studied in the range from 0.995 to 1.020, and appropriate ranges of widths WCA and WCB of side regions 21A and 21B are studied in the range from 0 to 10λ.

Next, the characteristics of elastic wave device 1002 in accordance with Embodiment 2 will be described below. A bandwidth at which an insertion loss becomes 1.5 dB is found based on the waveform of propagation characteristics of dual-terminal-pair resonator 23. The wider bandwidth produces the smaller insertion loss of elastic wave device 1002.

FIGS. 7A to 7E show bandwidth characteristics of elastic wave device 1002 including dummy regions 22A and 22B for various values of widths WCA and WCB of side regions 21A and 21B of device 1002. Widths WDA and WDB of dummy regions 22A and 22B are 2.5 µm (=1.25λ). In FIGS. 7A to 7E, the horizontal axis represents expansion ratio α, and the vertical axis represents the bandwidth. Width WCA (WCB) of side region 21A (21B) takes values of 0, λ, 3λ, 6λ, and 10λ in FIGS. 7A, 7B, 7C, 7D, and 7E, respectively. The comparative example has expansion ratio α of 1 and widths WCA and WCB of side regions 21A and 21B of 0.

Figure 7A:
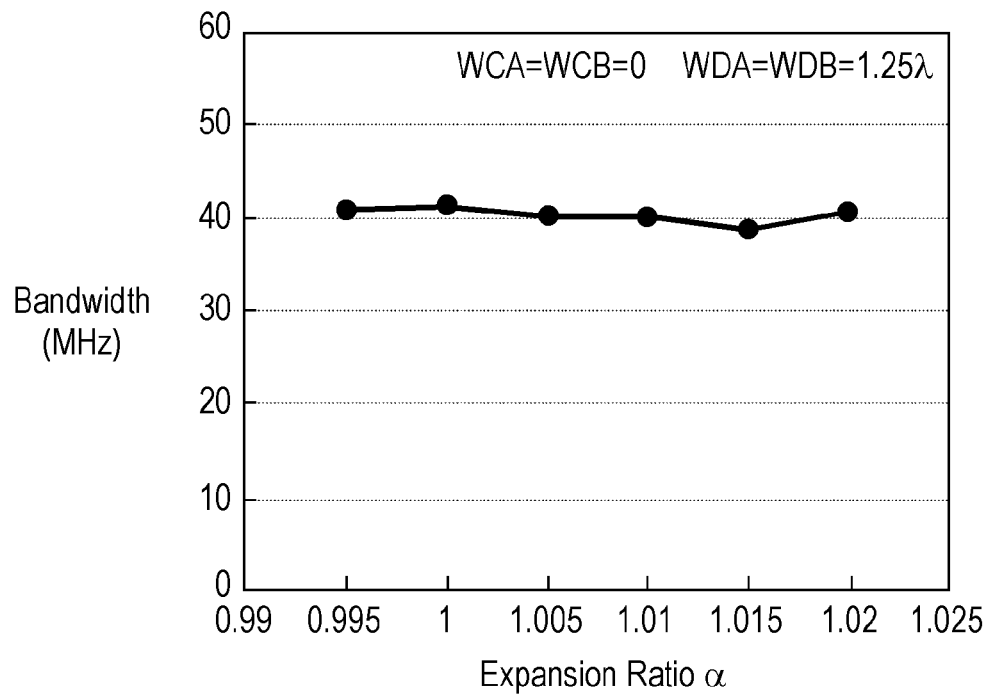
FIG. 7A shows bandwidth characteristics of an elastic wave device having a dummy region in accordance with Embodiment 2 having a side region having a width of 0.

As shown in FIG. 7A, in dual-terminal-pair resonator 23 having dummy regions 22A and 22B, when widths WCA and WCB of side regions 21A and 21B is 0 and the pitch of the electrode fingers is widened only in dummy regions 22A and 22B, there is little difference from the comparative example having expansion ratio α of 1. The structure shown in FIG. 7A thus does not produce any advantage.

Figure 7B:
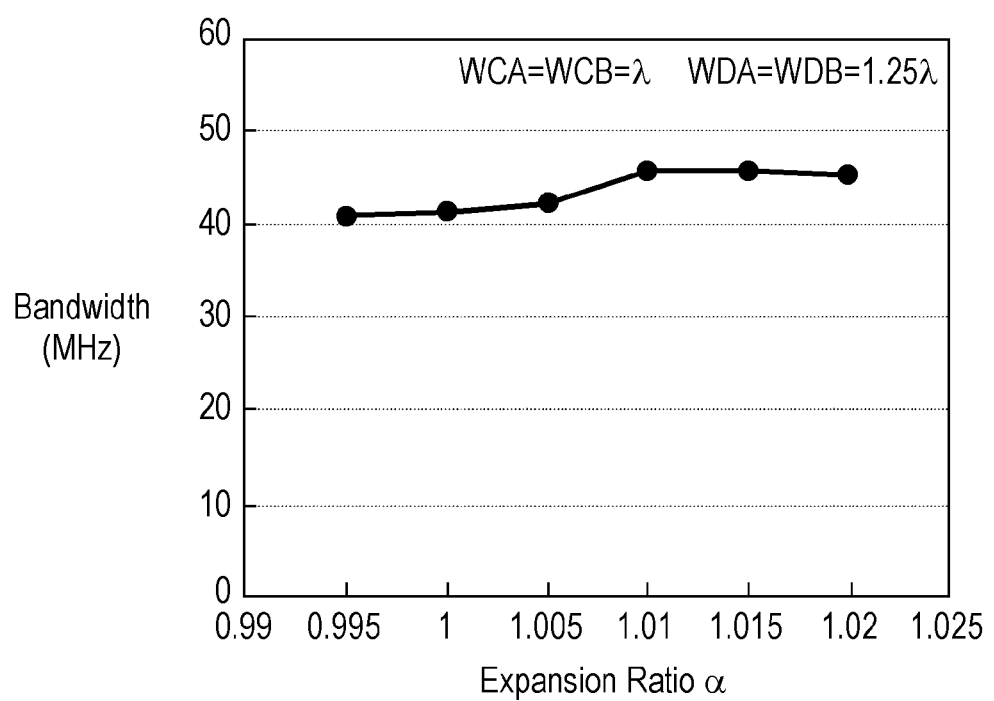
FIG. 7B shows bandwidth characteristics of an elastic wave device having a dummy region in accordance with Embodiment 2 having a side region having a width of one wavelength of the elastic wave.
Figure 7C:
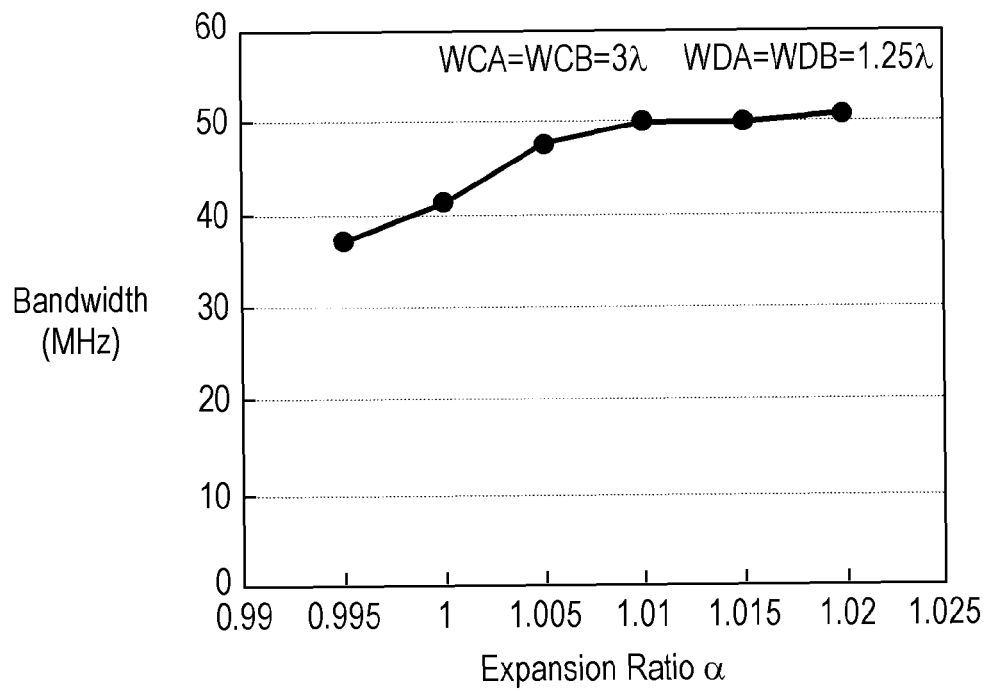
FIG. 7C shows bandwidth characteristics of an elastic wave device having a dummy region in accordance with Embodiment 2 having a side region having a width of three times of the wavelength of the elastic wave.

As shown in FIGS. 7B and 7C, in dual-terminal-pair resonator 23 having dummy regions 22A and 22B, when each of widths WCA and WCB of side regions 21A and 21B ranges from λ to 3λ, the bandwidth at which insertion loss is 1.5 dB is wider than that of the comparative example. In the case that widths WCA and WCB are λ, the bandwidth becomes wider by about 13% while expansion ratio α ranges from 1.01 to 1.020. In the case that widths WCA and WCB are 3λ, the bandwidth becomes wider by about 25% while expansion ratio α ranges from 1.01 to 1.020. The structures shown in FIGS. 7B and 7C thus can advantageously reduce the insertion loss.

Figure 7D:
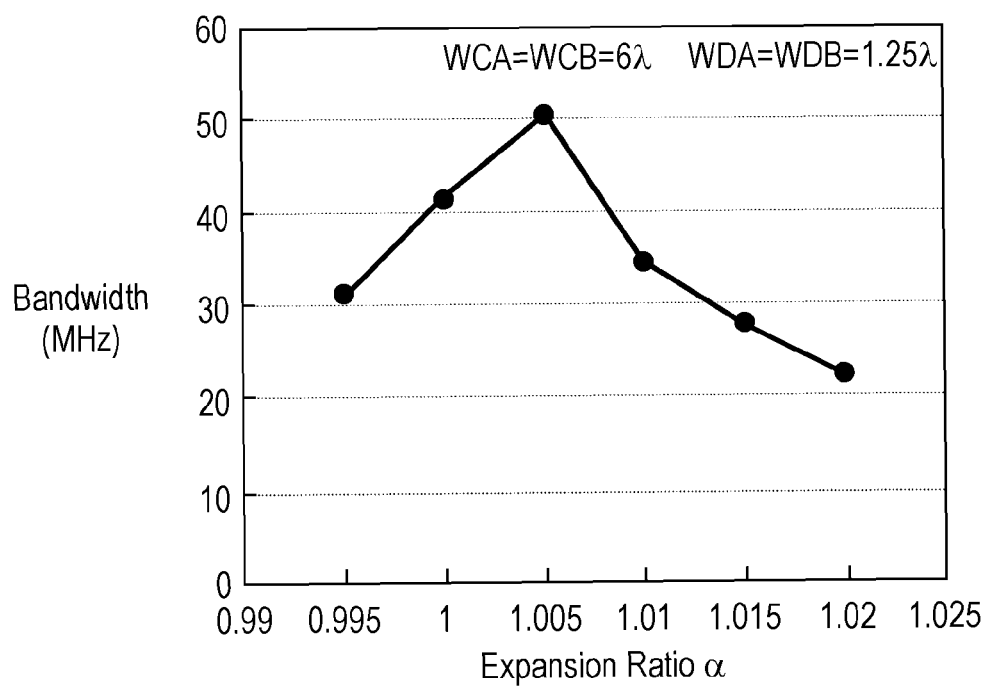
FIG. 7D shows bandwidth characteristics of an elastic wave device having a dummy region in accordance with Embodiment 2 having a side region having a width of six times of the wavelength of the elastic wave.
Figure 7E:
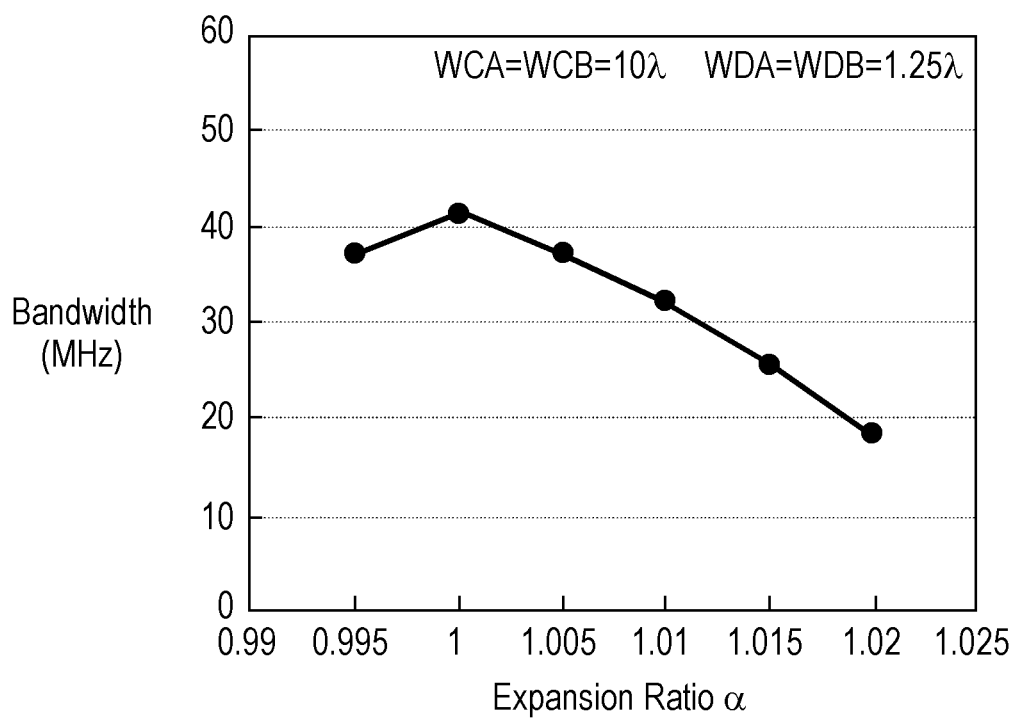
FIG. 7E shows bandwidth characteristics of an elastic wave device having a dummy region in accordance with Embodiment 2 having a side region having a width of ten times of the wavelength of the elastic wave.
Figure 8A:
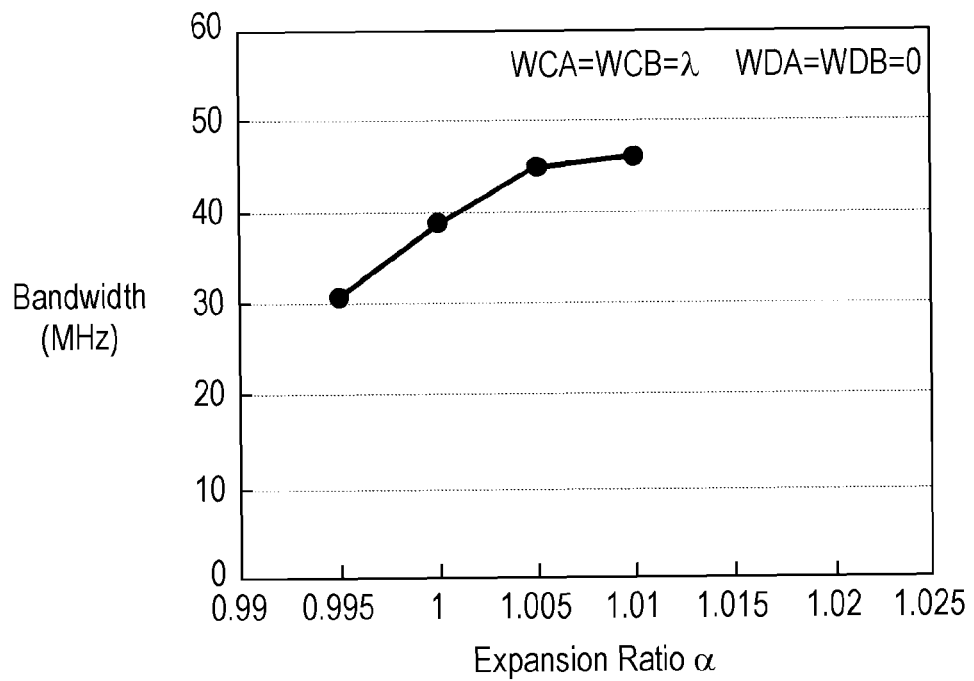
FIG. 8A shows bandwidth characteristics of an elastic wave device having no dummy region in accordance with Embodiment 2 having a side region having a width of one wavelength of the elastic wave.
Figure 8B:
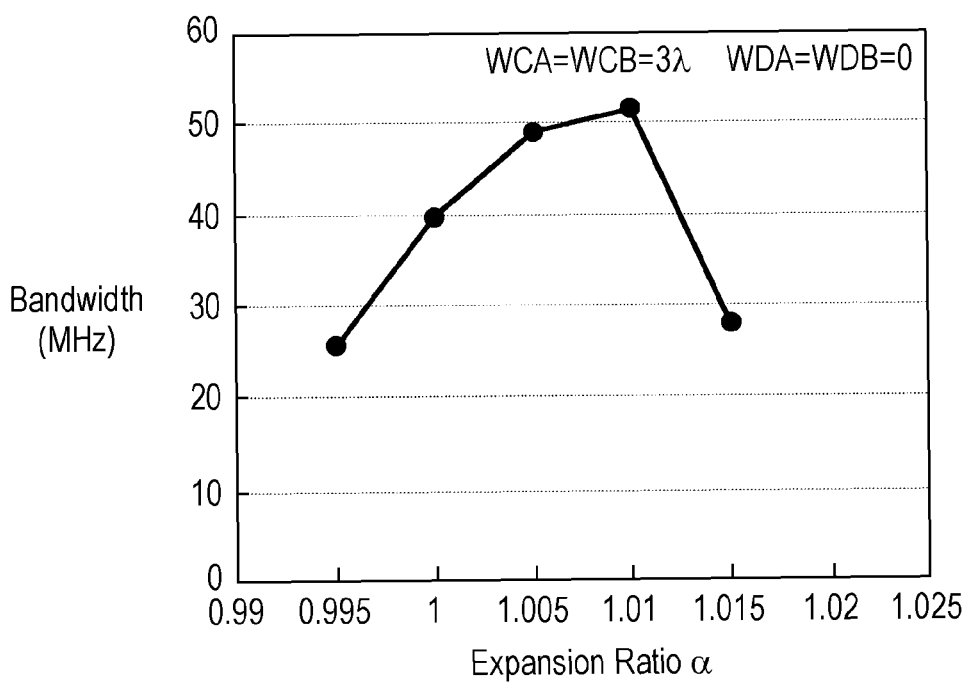
FIG. 8B shows bandwidth characteristics of an elastic wave device having no dummy region in accordance with Embodiment 2 having a side region having a width of three times of the wavelength of the elastic wave.
Figure 8C:
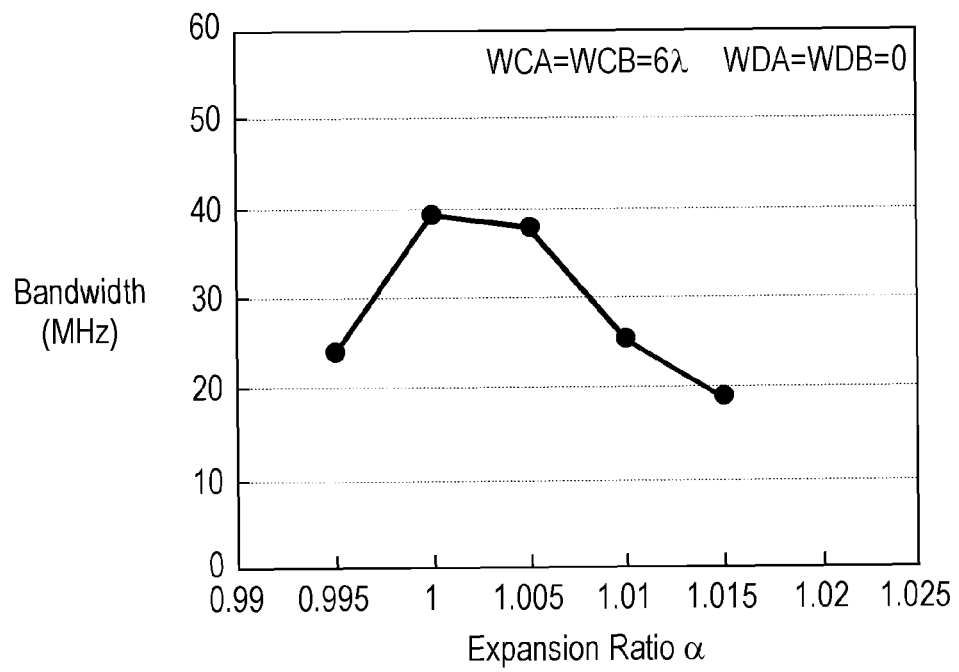
FIG. 8C shows bandwidth characteristics of an elastic wave device having no dummy region in accordance with Embodiment 2 having a side region having a width of six times of the wavelength of the elastic wave.
Figure 8D:
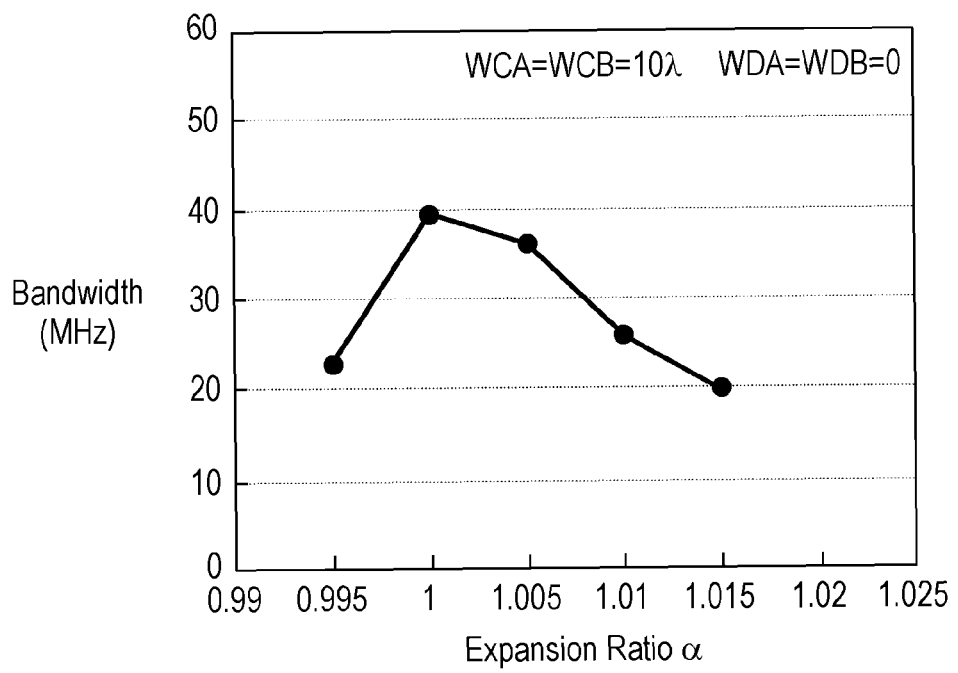
FIG. 8D shows bandwidth characteristics of an elastic wave device having no dummy region in accordance with Embodiment 2 having a side region having a width of ten times of the wavelength of the elastic wave.

As shown in FIGS. 7D and 7E, in dual-terminal-pair resonator 23 having dummy regions 22A and 22B, when each of widths WCA and WCB of side regions 21A and 21B ranges from 6λ to 10λ, the bandwidth at which insertion loss is 1.5 dB becomes narrower than that of the comparative example, so that those structures produce adversely a larger insertion loss.

As described above, dual-terminal-pair resonator 23 having dummy regions 22A and 22B, i.e., including dummy electrode fingers 17A and 17B, can produce a smaller insertion loss than the comparative example under the condition that each of widths WCA and WCB of side regions 21A and 21B ranges from λ to 3λ and expansion ratio α ranges from 1.01 to 1.020. The electrical characteristics of elastic wave device 1002 can be thus improved.

FIGS. 8A to 8D show the bandwidth characteristics of elastic wave device 1002 having none of dummy regions 22A and 22B under the condition of various values of widths WCA and WCB of side regions 21A and 21B. Since widths WDA and WDB of dummy regions described in FIGS. 8A to 8D are 0, elastic wave devices 1002 include none of dummy electrode fingers 17A and 17B. In FIGS. 8A to 8g, the horizontal axis represents expansion ratio α, and the vertical axis represents the bandwidth. Width WCA (WCB) of side region 21A (21B) takes values of λ, 3λ, 6λ, and 10λ in FIGS. 8A, 8B, 8C, and 8D, respectively. The comparative example has expansion ratio α of 1 and each of widths WCA and WCB of side regions 21A and 21B of 0.

As shown in FIGS. 8A to 8D, in dual-terminal-pair resonator 23 having none of dummy regions 22A and 22B, i.e., having none of dummy electrode fingers 17A and 17B, when each of widths WCA and WCB of side regions 21A and 21B ranges from λ to 3λ and expansion ratio α ranges from 1.005 to 1.01, the bandwidth is wider by about 13 to 25% than that of the comparative example. The insertion loss can be thus slightly lowered. When each of widths WCA and WCB of side regions 21A and 21B ranges from 6λ to 10λ, the bandwidth becomes narrower than that of the comparative example, so that the insertion loss increases.

As discussed above, dual-terminal-pair resonator 23 having none of dummy regions 22A and 22B, i.e., having none of dummy electrode fingers 17A and 17B, can produce a smaller insertion loss than the comparative example under the condition that each of widths WCA and WCB of side regions 21A and 21B ranges from λ to 3λ and expansion ratio α ranges from 1.005 to 1.01, thus improving the electrical characteristics of elastic wave device 1002.

Side regions 21A and 21B in which the pitch of interdigital electrode fingers 16A and 16B becomes wider gradually as located away from center region 20 provides elastic wave device 1002 in accordance with Embodiment 2 with a small insertion loss of dual-terminal-pair resonator 23.

The elastic wave device having none of dummy regions 22A and 22B, i.e., having none of dummy electrode fingers 17A and 17B, can include side regions 21A and 21B to reduce the insertion loss.

Center region 20 and side regions 21A and 21B are provided in each of plural comb-shaped electrode pairs 14 reduces the insertion loss.

In elastic wave device 1002 shown in FIG. 6 including dual-terminal-pair resonator 23 that has plural comb-shaped electrode pairs 14, electrode fingers 16A, 16B, 17A, and 17B in side regions 21A and 21B and dummy regions 22A and 22B flare along direction D1 oppositely to each other from one point, and the electrode fingers of plural comb-shaped electrode pairs 14 and reflecting electrodes 13 form the same curvature for effectively reducing the insertion loss.

In center region 20, a pitch of electrode fingers 16A and 16B of dual-terminal-pair resonator 23 is constant along propagating direction D1 of the elastic wave; however, the pitch in center region 20 may change along propagating direction D1. For instance, the pitch of interdigital electrode fingers 16A and 16B in center region 20 may change gradually like gradation between two comb-shaped electrode pairs 14 or at the vicinity between comb-shaped electrode pair 14 and reflecting electrode 13 along propagating direction D1. The structure discussed above can reduce the insertion loss.

Elastic wave device 1002 in accordance with Embodiment 2 includes dual-terminal-pair resonator 23 that includes two comb-shaped electrode pairs 14; however, the present invention is applicable to a dual-terminal-pair resonator that includes three or more comb-shaped electrode pairs 14, providing the same effect.

Exemplary Embodiment 3

Figure 9A:
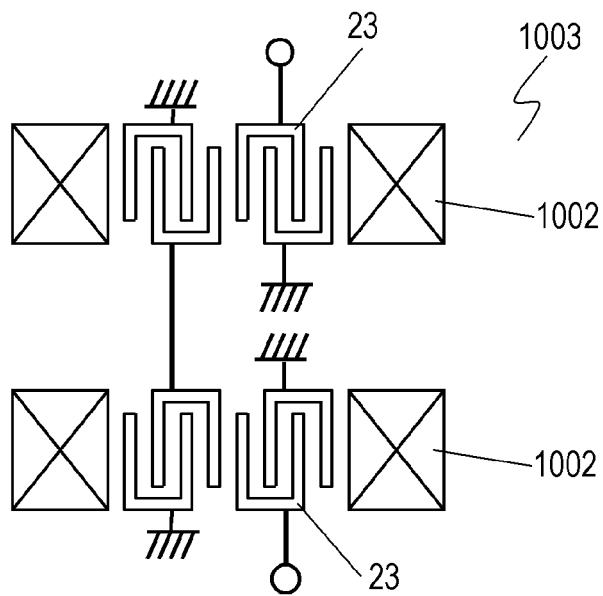
FIG. 9A is a circuit diagram of an elastic wave device in accordance with Exemplary Embodiment 3 of the present invention.

FIG. 9A is a circuit diagram of elastic wave device 1003 in accordance with Exemplary Embodiment 3 of the present invention. In FIG. 9A, components identical to those of elastic wave device 1002 shown in FIG. 6 according to Embodiment 2 are denoted by the same reference numerals. Elastic wave device 1003 includes two elastic wave devices 1002 each including dual-terminal-pair resonator 23 of two-electrode type. Each of two resonators 23 constitutes a longitudinally-coupled resonator type elastic wave filter.

Figure 9B:
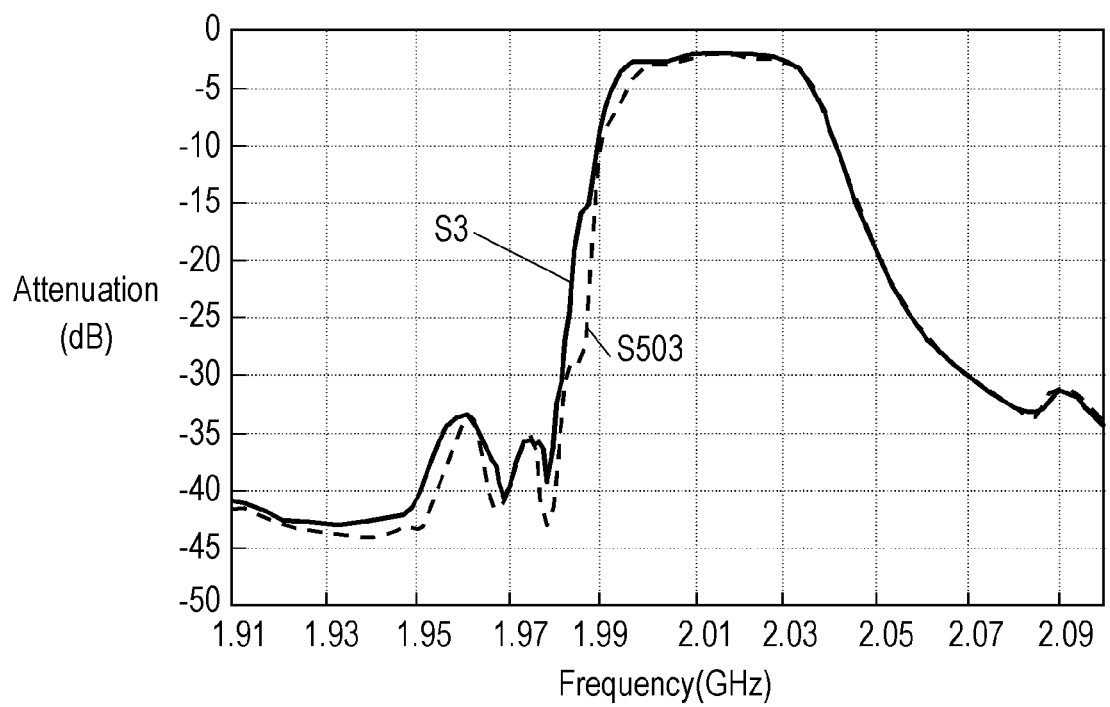
FIG. 9B shows propagation characteristics of the elastic wave device in accordance with Embodiment 3.

FIG. 9B shows propagation characteristics of elastic wave device 1003. In FIG. 9B, the horizontal represents a frequency, and the vertical axis represents attenuation. Two dual terminal pair resonators 23 of two electrode-type shown in FIG. 9A include dummy regions 22A and 22B (shown in FIG. 6), and are longitudinally coupled to each other to form a band-pass filter. FIG. 9B shows propagation profile S3 of elastic wave device 1003 and propagation profile S503 of a comparative example having none of side regions 21A and 21B and having expansion ratio α of 1 of the pitch of the electrode fingers of each of the dual-terminal-pair resonators. Each of two dual-terminal-pair resonators 23 has expansion ratio α of 1.01 and widths WCA and WCB of 3λ of side regions 21A, 21B. As shown in FIG. 9B, elastic wave device 1003 having expansion ratio α of 1.01 and widths WCA and WCB of 3λ can reduce the insertion loss by 0.3 to 0.4 dB from that of the comparative example, thus improving the characteristics of device 1003.

As discussed above, elastic wave device 1003 in accordance with Embodiment 3 is a band-pass filter including two dual-terminal-pair resonators 23 longitudinally coupled to each other. Side regions 21A and 21B in which the pitch of the electrode fingers becomes wider gradually as located away from center region 20 drastically reduce the insertion loss.

Exemplary Embodiment 4

Figure 10A:
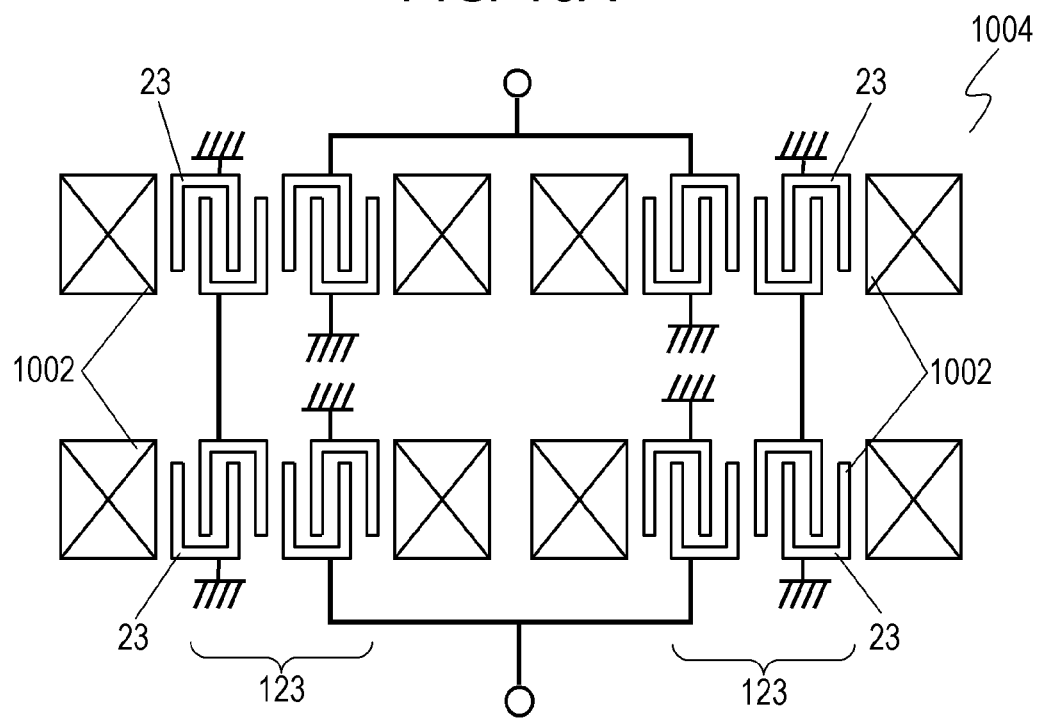
FIG. 10A is a circuit diagram of an elastic wave device in accordance with Exemplary Embodiment 4 of the present invention.

FIG. 10A is a circuit diagram of elastic wave device 1004 in accordance with Exemplary Embodiment 4 of the present invention. In FIG. 10A, components identical to those of elastic wave device 1002 shown in FIG. 6 according to Embodiment 2 are denoted by the same reference numerals. Elastic wave device 1004 includes four elastic wave devices 1002 each including dual-terminal-pair resonator 23 of two-electrode type. Each of four resonators 23 constitutes a longitudinally coupled resonator type elastic wave filter. FIG.

Figure 10B:
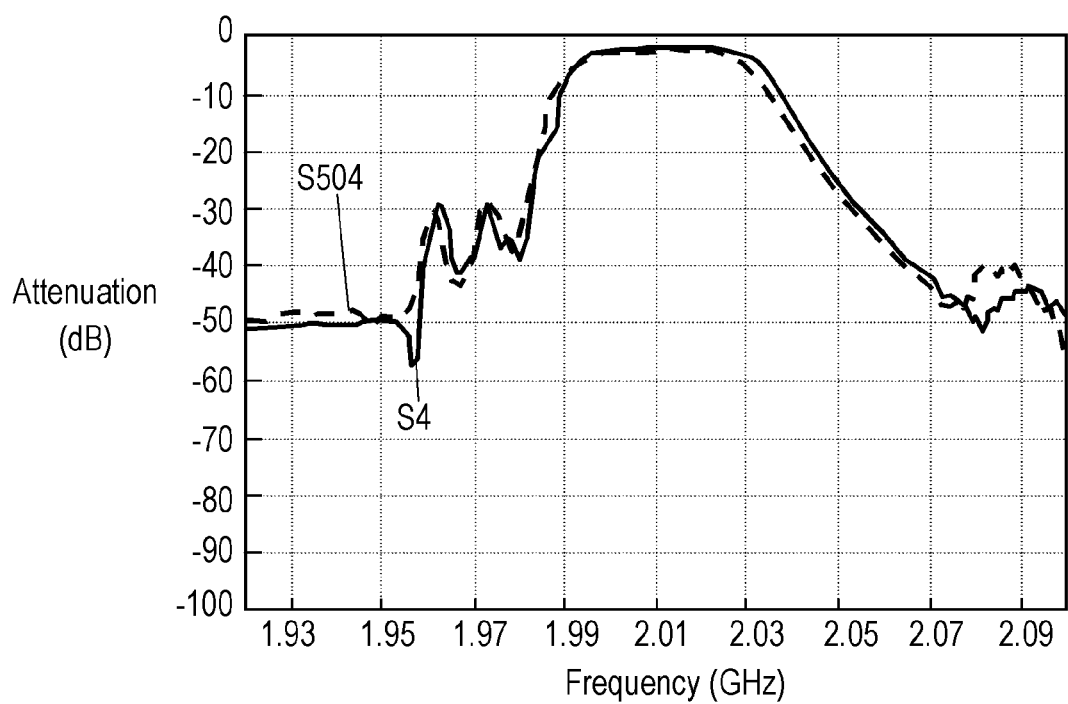
FIG. 10B shows propagation characteristics of the elastic wave device in accordance with Embodiment 4.
Figure 11:
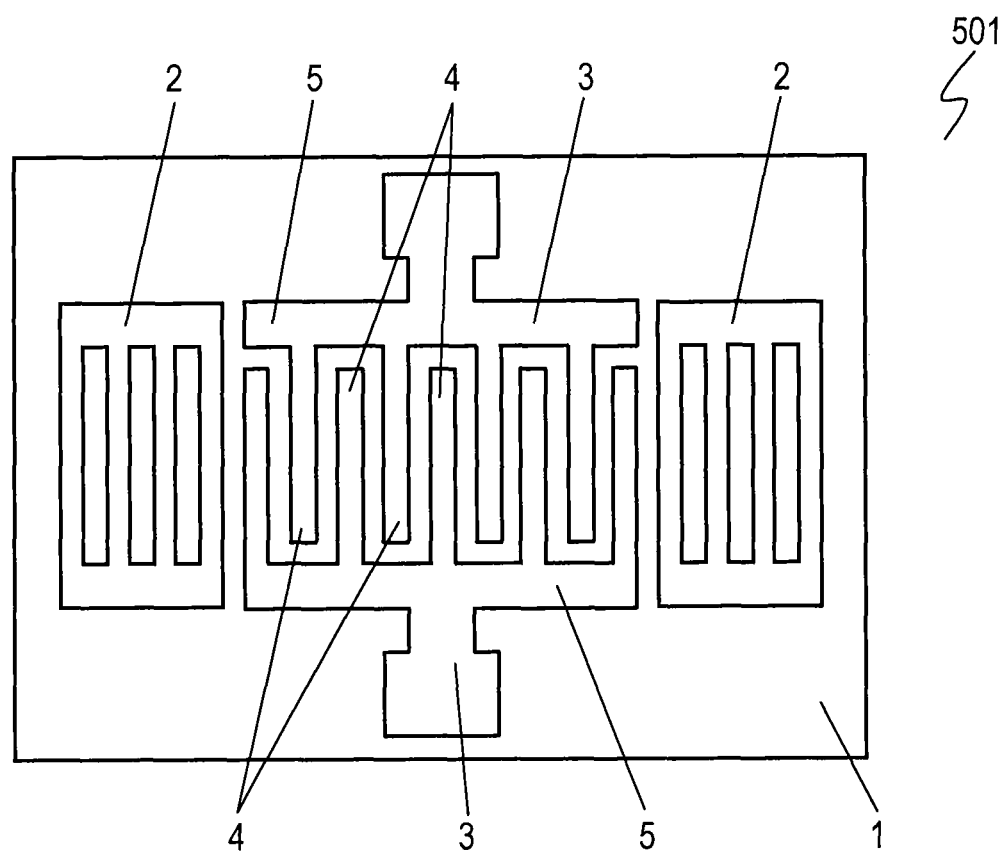
FIG. 11 is an electrode pattern diagram of a conventional elastic wave device.

10B shows propagation characteristics of elastic wave device 1004. In FIG. 10B, the horizontal axis represents a frequency, and the vertical axis represents attenuation. Four dual terminal pair resonators 23 of two electrode-type shown in FIG. 10A include dummy regions 22A and 22B (shown in FIG. 6). Two of the four resonators 23 are longitudinally coupled to each other to form longitudinally coupled circuit 123, namely, two circuits 123 are connected together in parallel to each other to form a band-pass filter. FIG. 10B shows propagation profile S4 of elastic wave device 1004 and propagation profile S504 of a comparative example including none of side regions 21A and 21B and having expansion ratio α of 1 of the pitch of the electrode fingers of each of the dual-terminal-pair resonators. Each of four dual terminal pair resonators 23 has expansion ratio α of 1.01 and widths WCA and WCB of 3λ of side regions 21A and 21B. As shown in FIG. 10B, elastic wave device 1004 having expansion ratio α of 1.01 and widths WCA and WCB of 3λ can reduce the insertion loss by about 4 dB from that of the comparative example, thus improving the characteristics of device 1004.

As discussed above, elastic wave device 1004 in accordance with Embodiment 7 is a band-pass filter including four dual-terminal-pair resonators 23. Side regions 21A and 21B in which the pitch of the electrode fingers becomes wider gradually as located away from center region 20 reduce the insertion loss.

INDUSTRIAL APPLICABILITY

An elastic wave device according to the present invention can reduce a loss of resonating energy, thereby reducing an insertion loss. The elastic device is useful for an elastic wave filter to be used mainly in mobile communication devices.

DESCRIPTION OF REFERENCE MARKS

11 Piezoelectric Substrate
12 Elastic Wave Resonator
13 Reflecting Electrode (First Reflecting Electrode, Second Reflecting Electrode)
14 Comb-Shaped Electrode Pair
15A Common Electrode (First Common Electrode)
15B Common Electrode (Second Common Electrode)
16A Interdigital Electrode Finger (First Interdigital Electrode Finger)
16B Interdigital Electrode Finger (Second Interdigital Electrode Finger)
17A Dummy Electrode Finger (First Dummy Electrode Finger)
17B Dummy Electrode Finger (Second Dummy Electrode Finger)
20 Center Region (First Region, Fourth Region)
21A Side Region (Second Region, Fifth Region)
21B Side Region (Third Region, Sixth Region)
22A Dummy Region
22B Dummy Region
23 Dual Terminal Pair Resonator
51A Comb-Shaped Electrode (First Comb-Shaped Electrode)
51B Comb-Shaped Electrode (Second Comb-Shaped Electrode)
52A Common Electrode (First Common Electrode)
52B Common Electrode (Second Common Electrode)
53 Reflecting Electrode Finger

The invention claimed is:

1. An elastic wave device comprising:
a piezoelectric substrate having a reciprocal velocity plane which is concave in a propagating direction in which an elastic wave propagates; and
an elastic wave resonator including a comb-shaped electrode pair which includes a first comb-shaped electrode and a second comb-shaped electrode both provided on the piezoelectric substrate, the first comb-shaped electrode and the second comb-shaped electrode interdigitating with each other, comb-shaped electrode pair being configured to trap energy of the elastic wave therein,
wherein the first comb-shaped electrode includes a first common electrode and a plurality of first interdigital electrode fingers connected to the first common electrode,
wherein the second comb-shaped electrode includes a second common electrode and a plurality of second interdigital electrode fingers connected to the second common electrode, the plurality of second interdigital electrode fingers interdigitaing with the plurality of first interdigital electrode fingers, and
wherein the elastic wave resonator has:
a first region in which the plurality of first interdigital electrode fingers interdigitate with the plurality of second interdigital electrode fingers, and a pitch of the first interdigital electrode fingers and the second interdigital electrode fingers is constant along a direction perpendicular to the propagating direction,
a second region provided between the first region and the first common electrode, and a pitch of the first interdigital electrode fingers and the second interdigital electrode fingers in the second region is wider than the pitch in the first region, and
a third region provided between the first region and the second common electrode, and a pitch of the first interdigital electrode fingers and the second interdigital electrode fingers in the third region is wider than the pitch in the first region.

2. The elastic wave device according to claim 1,
wherein the elastic wave resonator further includes first and second reflecting electrodes disposed on the piezoelectric substrate, the comb-shaped electrode pair being disposed between the first reflecting electrode and the second reflecting electrode,
wherein each of the first and the second reflecting electrodes includes third and fourth common electrodes and a plurality of reflecting electrode fingers disposed between the third and fourth common electrodes and connected to the third and fourth common electrodes,
wherein each of the first and the second reflecting electrodes has:
a fourth region in which a pitch of the plurality of reflecting electrode fingers is constant along a direction perpendicular to the propagating direction;
a fifth region provided between the fourth region and the third common electrode, and a pitch of the plurality of reflecting electrode fingers in the fifth region is wider than the pitch in the fourth region; and
a sixth region disposed between the fourth region and the fourth common electrode, and a pitch of the plurality of reflecting electrode fingers in the sixth region is wider than the pitch in the fourth region.

3. The elastic wave device according to claim 2, wherein the elastic wave resonator further includes another comb-shaped electrode pair disposed between the first reflecting electrode and the comb-shaped electrode pair, the elastic wave resonator constituting a dual terminal pair resonator.

4. The elastic wave device according to claim 3, wherein the another comb-shaped electrode pair has the first region, the second region, and the third region.

5. The elastic wave device according to claim 1,
wherein the first comb-shaped electrode further includes a plurality of first dummy electrode fingers connected to the first common electrode, the plurality of first dummy electrode fingers having tips facing tips of the plurality of second interdigital electrode fingers in extending directions of the plurality of second interdigital electrode fingers across gaps, respectively,
wherein the second comb-shaped electrode further includes a plurality of second dummy electrode fingers connected to the second common electrode, the plurality of second dummy electrode fingers having tips facing tips of the plurality of first interdigital electrode fingers in extending directions of the plurality of first interdigital electrode fingers via a gap, respectively,
wherein a pitch of the plurality of first dummy electrode fingers and the plurality of first interdigital electrode fingers is wider than the pitch of the plurality of first interdigital electrode fingers and the plurality of second interdigital electrode fingers in the second region, and
wherein a pitch of the plurality of second dummy electrode fingers and the plurality of second interdigital electrode fingers is wider than the pitch of the plurality of first interdigital electrode fingers and the plurality of second interdigital electrode fingers in the third region.

6. The elastic wave device according to claim 5, wherein a ratio of a width of the plurality of first interdigital electrode fingers, the plurality of second interdigital electrode fingers, the plurality of first dummy electrode fingers, and the plurality of second dummy electrode fingers to the pitch is constant along the direction perpendicular to the propagating direction.

7. The elastic wave device according to claim 5, wherein a pitch of the plurality of first dummy electrode fingers and the plurality of first interdigital electrode fingers becomes wider as located away from the second region, and a pitch of the plurality of second dummy electrode fingers and the plurality of second interdigital electrode fingers becomes wider as located away from the third region.

8. The elastic wave device according to claim 5,
wherein each of the plurality of first interdigital electrode fingers and respective one of the plurality of second dummy electrode fingers extend along a line including a plurality of straight lines connected to each other or a smooth curved line, and
wherein each of the plurality of second interdigital electrode fingers and respective one of the plurality of first dummy electrode fingers extend along a line including a plurality of straight lines connected to each other or a smooth curved line.

9. The elastic wave device according to claim 5, wherein a maximum pitch of the plurality of first interdigital electrode fingers and the plurality of first dummy electrode fingers, and a maximum pitch of the plurality of second interdigital electrode fingers and the plurality of second dummy electrode fingers are not smaller than $1.005 \times P0$, where $P0$ is the pitch in the first region.

10. The elastic wave device according to claim 5, wherein a maximum pitch of the plurality of first interdigital electrode fingers and the plurality of first dummy electrode fingers, and a maximum pitch of the plurality of second interdigital electrode fingers and the plurality of second dummy electrode fingers are not greater than $1.020 \times P0$, where $P0$ is the pitch in the first region.

11. The elastic wave device according to claim 1, wherein the pitch in the second region and the pitch in the third region become wider as located away from the first region.

12. The elastic wave device according to claim 1,
wherein the plurality of first interdigital electrode fingers extend in the second region along a continuous curve or a line including a plurality of straight lines connected to each other, and
wherein the plurality of second interdigital electrode fingers extend in the third region along a continuous curve or a line including a plurality of straight lines connected to each other.

13. The elastic wave device according to claim 1,
wherein the plurality of first interdigital electrode fingers extend along a smooth curved line from the second region to the first region, and
wherein the plurality of second interdigital electrode fingers along a smooth curved line extend from the third region to the first region.

14. The elastic wave device according to claim 1, wherein a ratio of each of widths of the plurality of first interdigital electrode fingers and the plurality of second interdigital electrode fingers to the pitch is constant along the direction perpendicular to the propagating direction.

15. The elastic wave device according to claim 1, wherein the pitch changes along the propagating direction.

16. The elastic wave device according to claim 1, wherein a maximum pitch in the second region is not smaller than $1.005 \times P0$, where $P0$ is the pitch in the first region.

17. The elastic wave device according to claim 1, wherein a maximum pitch in the second region is not greater than $1.020 \times P0$, where $P0$ is the pitch in the first region.

18. The elastic wave device according to claim 1, wherein, in a case that the pitch in the first region are $\lambda/2$, a width of the second region in the direction perpendicular to the propagating direction is not smaller than $\lambda$.

19. The elastic wave device according to claim 1,
wherein the elastic wave resonator is a terminal pair resonator, and
wherein the elastic wave resonator is connected to a signal path in series or between the signal path and a ground.

20. An elastic wave device comprising:
a piezoelectric substrate having a reciprocal velocity plane which is concave in a propagating direction in which an elastic wave propagates; and
an elastic wave resonator including first and second reflecting electrodes and a comb-shaped electrode pair disposed between the first and second reflecting electrodes, the first and second reflecting electrodes and the comb-shaped electrode pair being disposed on the piezoelectric substrate provided, the elastic wave resonator being configured to trap energy of the elastic wave therein,
wherein each of the first reflecting electrode and the second reflecting electrode includes a first common electrode, a second common electrode, and a plurality of reflecting electrode fingers disposed between the first and second common electrodes and connected to the first and second common electrodes,
wherein each of the first reflecting electrode and the second reflecting electrode has:
a first region in which a pitch of the plurality of reflecting electrode fingers is constant along a direction perpendicular to the propagating direction, a second region provided between the first region and the first common electrode, and a pitch of the plurality of reflecting electrode fingers in the second region is wider than the pitch in the first region, and a third region disposed between the first region and the second common electrode, and a pitch of the plurality of reflecting electrode fingers in the third region are wider than the pitch in the first region.

21. The elastic wave device according to claim 20, wherein the elastic wave resonator further includes another comb-shaped electrode pair disposed between the first reflecting electrode and the comb-shaped electrode pair, the elastic wave resonator constituting a dual terminal pair resonator.

22. The elastic wave device according to claim 20, wherein the another comb-shaped electrode pair has the first region and the second region.

* * * * *